United States Patent
Hwang et al.

(10) Patent No.: US 9,368,729 B2
(45) Date of Patent: Jun. 14, 2016

(54) MIXTURES FOR PRODUCING PHOTOACTIVE LAYERS FOR ORGANIC SOLAR CELLS AND ORGANIC PHOTODETECTORS

(75) Inventors: Jae Hyung Hwang, Viernheim (DE); Peter Erk, Frankenthal (DE); Helmut Reichelt, Neustadt (DE); Ruediger Sens, Ludwigshafen (DE); Ingmar Bruder, Harthausen (DE); Antti Ojala, Tampere (FI); Jan Schoeneboom, Mannheim (DE); Frank Wuerthner, Hoechberg (DE); Hannah Buerckstuemmer, Darmstadt (DE); Elena Tulyakova, Luxembourg (LU); Klaus Meerholz, Roesrath (DE); Vera Steinmann, Hamm (DE); Nils Kronenberg, Dresden (DE)

(73) Assignee: BASF SE, Ludwigshafen (DE)

( * ) Notice: Subject to any disclaimer, the term of this patent is extended or adjusted under 35 U.S.C. 154(b) by 916 days.

(21) Appl. No.: 13/501,018

(22) PCT Filed: Oct. 11, 2010

(86) PCT No.: PCT/EP2010/065152
§ 371 (c)(1),
(2), (4) Date: Jun. 25, 2012

(87) PCT Pub. No.: WO2011/045253
PCT Pub. Date: Apr. 21, 2011

(65) Prior Publication Data
US 2012/0267579 A1 Oct. 25, 2012

(30) Foreign Application Priority Data
Oct. 13, 2009 (EP) .................................... 09172939

(51) Int. Cl.
| | |
|---|---|
| H01L 51/00 | (2006.01) |
| H01L 51/44 | (2006.01) |
| B82Y 10/00 | (2011.01) |
| C09B 23/01 | (2006.01) |
| C09B 23/10 | (2006.01) |
| H01L 27/30 | (2006.01) |
| H01L 51/42 | (2006.01) |

(52) U.S. Cl.
CPC ............ *H01L 51/0064* (2013.01); *B82Y 10/00* (2013.01); *C09B 23/0091* (2013.01); *C09B 23/105* (2013.01); *H01L 27/302* (2013.01); *H01L 51/001* (2013.01); *H01L 51/0046* (2013.01); *H01L 51/0047* (2013.01); *H01L 51/4253* (2013.01); *Y02E 10/549* (2013.01); *Y02P 70/521* (2015.11)

(58) Field of Classification Search
CPC ............ H01L 51/005; H01L 51/0064; H01L 51/0046; H01L 51/441
USPC ......................................................... 252/500
See application file for complete search history.

(56) References Cited

U.S. PATENT DOCUMENTS

| | | | |
|---|---|---|---|
| 5,079,365 | A | 1/1992 | Sens et al. |
| 5,147,845 | A | 9/1992 | Sens et al. |
| 5,256,624 | A | 10/1993 | Etzbach et al. |
| 5,703,238 | A | 12/1997 | Schefczik et al. |
| 6,086,637 | A | 7/2000 | Grund et al. |
| 2003/0152827 | A1 | 8/2003 | Ikeda et al. |
| 2005/0098726 | A1 | 5/2005 | Peumans et al. |
| 2005/0224905 | A1 | 10/2005 | Forrest et al. |
| 2010/0140559 | A1 | 6/2010 | Klaus et al. |
| 2011/0256422 | A1 | 10/2011 | Reichelt et al. |

FOREIGN PATENT DOCUMENTS

| | | |
|---|---|---|
| DE | 195 02 702 | 8/1996 |
| EP | 0 291 853 | 11/1988 |
| EP | 0 416 434 | 3/1991 |
| EP | 0 509 302 | 10/1992 |
| FR | 1 520 818 | 4/1968 |
| WO | 99 25895 | 5/1999 |
| WO | 03 070822 | 8/2003 |
| WO | 2004 083958 | 9/2004 |
| WO | 2005 036667 | 4/2005 |
| WO | 2006 092134 | 9/2006 |
| WO | 2007 071450 | 6/2007 |
| WO | 2009 007340 | 1/2009 |

OTHER PUBLICATIONS

Yoon et al., Rigidity-Stability Relationship in Interlocked Model Complexes Containing Phenylene-Ethylene—Based Disubstituted Naphthalene and Benzene, American Chemical Society, 2009, vol. 9, No. 5, pp. 2300-2309.*

(Continued)

*Primary Examiner* — Ling Choi
*Assistant Examiner* — Thuy-Ai Nguyen
(74) *Attorney, Agent, or Firm* — Oblon, McClelland, Maier & Neustadt, L.L.P.

(57) ABSTRACT

The present invention relates to the use of mixtures which comprise, as components K1), one or more merocyanines selected from the group of the compounds of the general formulae Ia, Ib, Ic, Id, Ie, IIa and IIb, as defined in more detail in the description, as an electron donor or electron acceptor, and, as component K2), one or more compounds which, with respect to component K1), act correspondingly as an electron acceptor or electron donor, for producing photoactive layers for organic solar cells and organic photodetectors, to a process for producing photoactive layers, corresponding solar cells and organic photodetectors, and to mixtures which comprise, as components, one or more compounds of the general formulae Ia, Ib, Ic, Id, Ie, IIa and/or IIb of component K1, as defined in more detail in the description, and one or more compounds of component K2.

19 Claims, No Drawings

(56) References Cited

OTHER PUBLICATIONS

Andrii V. et al., Structure and Fluorescent Properties of Merocyanines based on N,N-diethylthiobarbituric acid, Journal of Photochemistry and Photobiology, Science Direct, Chemistry 197, 2008, pp. 40-49.*
U.S. Appl. No. 14/238,382, filed Feb. 11, 2014, Suraru, et al.
Wuerthner, F., et al., "ATOP Dyes. Optimization of a Multifunctional Merocyanine Chromophore for High Refractive Index Modulation in Photorefractive Materials," Journal of the American Chemical Society, vol. 123, pp. 2810-2824, (2001).
Wuerthner, F., et al., "Merocyaninfarbstoffe im Cyaninlimit: eine neue Chromophorklasse fuer photorefraktive Materialien," Angew. Chemie, vol. 109, No. 24, pp. 2933-2936, (1997).
Wuerthner, F., et al., "Merocyanine Dyes in the Cyanine Limit: A New Class of Chromophores for Photorefractive Materials," Angew. Chem. Int. Ed. Engl., vol. 36, No. 24, pp. 2765-2768, (1997).
Beckmann, S., et al., "Electrooptical Chromophores for Nonlinear Optical and Photorefractive Applications," Advanced Materials, vol. 11, No. 7, pp. 536-541, (1999).
Wuerthner, F., "DMF in Acetic Anhydride: A Useful Reagent for Multiple-Component Syntheses of Merocyanine Dyes," Synthesis, No. 12, pp. 2103-2113, (1999).
"Methine Dyes and Pigments," Ullmann's Encyclopedia of Industrial Chemistry, 5$^{th}$ Edition, vol. A16, pp. 487-535, (1990).
Zimmermann, T., "A Facile Synthesis of 3H-Indolium Perchlorates by One-pot Hydrazone Formation/Fischer Indolization," Journal of heterocyclic chemistry, vol. 37, p. 1571-1575, (Nov.-Dec. 2000).
Zimmermann, T., et al., "3H-Indolium Salts Efficiently Prepared from N-Substituted Anilines and α-Branched Ketones by an One-pot Synthesis," Journal of heterocyclic chemistry, vol. 41, pp. 103-109, (Jan.-Feb. 2004).
Kossler, M., et al., "Ueber den Einfluss des Donor-Teilchromophors bei Dimethinmerocyanin-Farbstoffen auf das Aggregationsverhalten in waessriger Loesung," Helvetica Chimica Acta, vol. 70, pp. 1583-1596, (1987) (with English abstract).
Kulinich, A.V., et al., "Synthesis and spectral properties of malononitrile-based merocyanine dyes," Russian Chemical Bulletin, International Edition, vol. 54, No. 12, pp. 2820-2830, (Dec. 2005).
Henary, M., et al., "Functionalization of Benzo[c,d]indole System for the Synthesis of Visible and Near-Infrared Dyes," Journal of Heterocyclic Chemistry, vol. 46, pp. 84-88, (2009).
Fritz, H., "Ueber α,β-ungesaettigte β-Anilino-carbonyl-Verbindungen als Modellsubstanzen fuer den Chromophor von C-Curarin-III (C-Fluorocurarin)," Chemische Berichte, vol. 92, No. 12, pp. 1809-1817, (1959).
Tsotinis, A., et al., "Synthesis of new tricyclic melatoninergic ligands," II Farmaco, vol. 56, pp. 725-729, (2001).
Desarbre, E., et al., "Heck Annulation on 2-Position of Indoles or 1H-Pyrrolo[2,3-b]Pyridine," Heterocycles, vol. 41, No. 9, pp. 1987-1999, (1995).
Dreschsel, J., et al., "High efficiency organic solar cells based on single or multiple PIN structures," Thin Solid Films, vol. 415-452, pp. 515-517, (2004).
International Search Report Issued Feb. 28, 2011 in PCT/EP10/65152 Filed Oct. 11, 2010.

* cited by examiner

MIXTURES FOR PRODUCING PHOTOACTIVE LAYERS FOR ORGANIC SOLAR CELLS AND ORGANIC PHOTODETECTORS

CROSS-REFERENCE TO RELATED APPLICATIONS

This application is a National Stage of PCT/EP2010/065152 filed on Oct. 11, 2010. This application is based upon and claims the benefit of priority to European Application No. 09172939.2 filed on Oct. 13, 2009.

The present invention relates to the use of mixtures comprising, as components, K1) one or more compounds selected from the group of the compounds of the general formulae

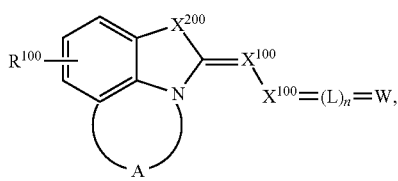
(Ia)

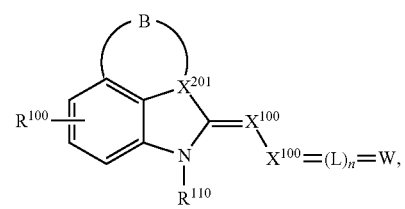
(Ib)

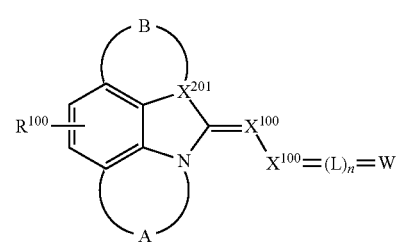
(Ic)

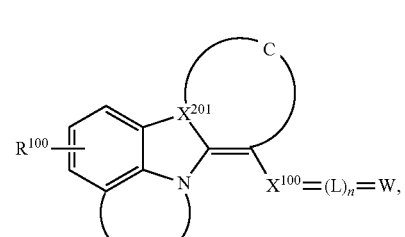
(Id)

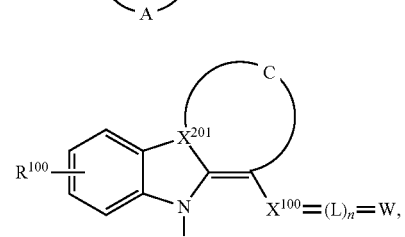
(Ie)

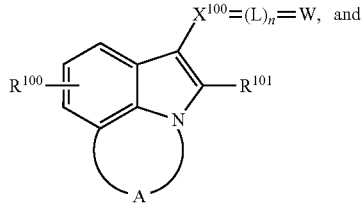
(IIa)

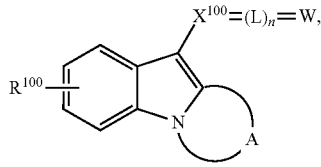
(IIb)

as an electron donor or electron acceptor, in which

A is a bridge consisting of two or three $sp^3$-hybridized carbon atoms, in which each carbon atom may additionally be substituted by one $R^{101}$ substituent each and which may additionally be benzofused, B, C are each bridges consisting of two or three $sp^2$- and/or $sp^3$-hybridized carbon atoms which may additionally be substituted by one $R^{101}$ substituent each, W is O, S, N—CN, N—$R^{110}$, $C(CN)_2$, $C(CO_2R^{110})_2$, $C(CN)COR^{110}$ or $C(CN)CO_2R^{110}$, $C(CN)CONR^{110}$, L is a divalent, optionally singly or multiply fused carbo- or heterocycle n is 0 or 1, $X^{100}$ is CH, N or C(CN), $X^{200}$ is $C(R^{111})_2$, O, S, $SO_2$ or $NR^{110}$, $X^{201}$ is $CR^{111}$ or an $sp^2$-hybridized unsubstituted carbon atom in the case that $X^{201}$ is bonded to an $sp^2$-hybridized carbon atom of the B or C bridge.

$R^{100}$ is H, alkyl, $C_1$-$C_6$-alkylene-COO-alkyl, $C_1$-$C_6$-alkylene-O—CO-alkyl, $C_1$-$C_6$-alkylene-O—CO—O-alkyl, cycloalkyl, arylalkyl, aryl, $OR^{110}$, $SR^{110}$, hetaryl, halogen, $NO_2$ or CN, $R^{101}$ is alkyl, $C_1$-$C_6$-alkylene-COO-alkyl, $C_1$-$C_6$-alkylene-O—CO-alkyl, $C_1$-$C_6$-alkylene-O—CO—O-alkyl, cycloalkyl, arylalkyl, aryl or hetaryl, $R^{110}$ is H, alkyl, $C_1$-$C_6$-alkylene-COO-alkyl, $C_1$-$C_6$-alkylene-O—CO-alkyl, $C_1$-$C_6$-alkylene-O—CO—O-alkyl, cycloalkyl, arylalkyl or aryl, $R^{111}$ is H, alkyl, $C_1$-$C_6$-alkylene-COO-alkyl, $C_1$-$C_6$-alkylene-O—CO-alkyl, $C_1$-$C_6$-alkylene-O—CO—O-alkyl, cycloalkyl, arylalkyl, aryl or hetaryl, where the carbon chains of the alkyl and cycloalkyl radicals may be interrupted by one or two nonadjacent oxygen atoms and the aforementioned variables, where they occur more than once, may be the same or different and K2) one or more compounds which, with respect to component K1), act correspondingly as an electron acceptor or electron donor for producing photoactive layers for organic solar cells and organic photodetectors, to a process for producing photoactive layers, corresponding solar cells and organic photodetectors, and to mixtures which comprise, as components, one or more compounds of the general formulae Ia, Ib, Ic, Id, Ie, IIa and/or IIb of component K1, and one or more compounds of component K2.

It is expected that, in the future, not only the conventional inorganic semiconductors but increasingly also organic semiconductors based on low molecular weight or polymeric materials will be used in many fields of the electronics industry. In many cases, these organic semiconductors have advantages over the classical inorganic semiconductors, for example better substrate compatibility and better processability of the semiconductor components based on them. They allow processing on flexible substrates and enable their interface orbital energies to be adjusted precisely to the particular application range by the methods of molecular modeling. The significantly reduced costs of such components have brought a renaissance to the field of research of organic electronics. Organic electronics is concerned principally with the development of new materials and manufacturing processes for the production of electronic components based on organic semiconductor layers. These include in particular organic field-effect transistors (OFETs) and organic light-emitting diodes (OLEDs; for example for use in displays), and organic photovoltaics.

The direct conversion of solar energy to electrical energy in solar cells is based on the internal photoeffect of a semiconductor material, i.e. the generation of electron hole pairs by absorption of photons and the separation of the negative and positive charge carriers at a p-n transition or a Schottky contact. The photovoltage thus generated can bring about a photocurrent in an external circuit, through which the solar cell delivers its power.

The semiconductor can absorb only those photons which have an energy which is greater than its band gap. The size of the semiconductor band gap thus determines the proportion of sunlight which can be converted to electrical energy. It is expected that, in the future, organic solar cells will outperform the classical solar cells based on silicon owing to lower costs, a lower weight, the possibility of producing flexible and/or colored cells, the better possibility of fine adjustment of the band gap. There is thus a great demand for organic semiconductors which are suitable for producing organic solar cells.

In order to utilize solar energy as effectively as possible, organic solar cells normally consist of two absorbing materials with different electron affinity or different ionization behavior. In that case, one material functions as a p-conductor (electron donor), the other as an n-conductor (electron acceptor). The first organic solar cells consisted of a two layer system composed of a copper phthalocyanine as a p-conductor and PTCBI as an n-conductor, and exhibited an efficiency of 1%. In order to utilize as many incident photons as possible, relatively high layer thicknesses are used (e.g. 100 nm). In order to generate current, the excited state generated by the absorbed photons must, however, reach a p-n junction in order to generate a hole and an electron, which then flows to the anode and cathode. Most organic semiconductors, however, have only diffusion lengths for the excited state of up to 10 nm. Even the best production processes known to date allow the distance over which the excited state has to be transmitted to be reduced to no less than from 10 to 30 nm.

More recent developments in organic photovoltaics have been in the direction of the so-called "bulk heterojunction": in this case, the photoactive layer comprises the acceptor and donor compound(s) as a bicontinuous phase. As a result of photoinduced charge transfer from the excited state of the donor compound to the acceptor compound, owing to the spatial proximity of the compounds, a rapid charge separation compared to other relaxation procedures takes place, and the holes and electrons which arise are removed via the corresponding electrodes. Between the electrodes and the photoactive layer, further layers, for example hole or electron transport layers, are often applied in order to increase the efficiency of such cells.

To date, the donor materials used in such bulk heterojunction cells have usually been polymers, for example polyvinylphenylenes or polythiophenes, or dyes from the class of the phthalocyanines, e.g. zinc phthalocyanine or vanadyl phthalocyanine, and the acceptor materials used have been fullerene and fullerene derivatives and also various perylenes. Photoactive layers composed of the donor/acceptor pairs poly (3-hexyl-thiophene) ("P3HT")/[6,6]-phenyl-$C_{61}$-butyric acid methyl ester ("PCBM"), poly(2-methoxy-5-(3,7-dimethyloctyloxy)-1,4-phenylenevinylene) ("$OC_1C_{10}$-PPV")/PCBM and zinc phthalocyanine/fullerene have been and are being researched intensively.

Organic solar cells using merocyanines are described in document WO 2009/007340 A1.

It was thus an object of the present invention to provide further photoactive layers for use in electronic components, especially in organic solar cells and organic photodetectors, which are easy to produce and have a sufficient efficiency for the conversion of light energy to electrical energy in industrial applications.

Accordingly, the use described at the outset of mixtures for producing photoactive layers for organic solar cells and organic photodetectors has been found.

The definitions of the variables listed above are explained in detail hereinafter and should be understood as follows.

Halogen denotes fluorine, chlorine, bromine and iodine, especially fluorine and chlorine.

Alkyl is understood to mean substituted or unsubstituted $C_1$-$C_{20}$-alkyl radicals. Preference is given to $C_1$- to $C_{10}$-alkyl radicals, particular preference to $C_1$- to $C_6$-alkyl radicals. The alkyl radicals may be either straight-chain or branched. In addition, the alkyl radicals may be substituted by one or more substituents selected from the group consisting of $C_1$-$C_{20}$-alkoxy, halogen, preferably F, and $C_6$-$C_{30}$-aryl which may in turn be substituted or unsubstituted. Suitable aryl substituents and suitable alkoxy and halogen substituents are specified hereinafter. Examples of suitable alkyl groups are methyl, ethyl, propyl, butyl, pentyl, hexyl, heptyl and octyl, and $C_6$-$C_{30}$-aryl-, $C_1$-$C_{20}$-alkoxy- and/or halogen-substituted, especially F-substituted derivates of the alkyl groups mentioned, for example $CF_3$. This includes both the n-isomers of the radicals mentioned and branched isomers such as isopropyl, isobutyl, isopentyl, sec-butyl, tert-butyl, neopentyl, 3,3-dimethylbutyl, 3-ethylhexyl, etc. Preferred alkyl groups are methyl, ethyl, propyl, tert-butyl and $CF_3$.

Cycloalkyl is understood to mean substituted or unsubstituted $C_3$-$C_{20}$-alkyl radicals. Preference is given to $C_3$- to $C_{10}$-alkyl radicals, particular preference to $C_3$- to $C_8$-alkyl radicals. The cycloalkyl radicals may bear one or more of the substituents mentioned for the alkyl radicals. Examples of suitable cyclic alkyl groups (cycloalkyl radicals), which may likewise be unsubstituted or substituted by the radicals mentioned above for the alkyl groups, are cyclopropyl, cyclobutyl, cyclopentyl, cyclohexyl, cycloheptyl, cyclooctyl, cyclononyl and cyclodecyl. They may optionally also be polycyclic ring systems, such as decalinyl, norbornyl, bornanyl or adamantyl.

Alkyl which is interrupted by one or two nonadjacent oxygen atoms includes, for example, 3-methoxyethyl, 2- and 3-methoxypropyl, 2-ethoxyethyl, 2- and 3-ethoxypropyl, 2-propoxyethyl, 2- and 3-propoxypropyl, 2-butoxyethyl, 2- and 3-butoxypropyl, 3,6-dioxaheptoyl and 3,6-dioxaoctyl.

Suitable aryls are $C_6$-$C_{30}$-aryl radicals which are derived from monocyclic, bicyclic or tricyclic aromatics which do not comprise any ring heteroatoms. When they are not monocyclic systems, the term "aryl" for the second ring may also include the saturated form (perhydro form) or the partly unsaturated form (for example the dihydro form or tetrahydro form), provided that the particular forms are known and stable. This means that the term "aryl" in the present invention also encompasses, for example, bicyclic or tricyclic radicals in which either both or all three radicals are aromatic, and bicyclic or tricyclic radicals in which only one ring is aromatic, and also tricyclic radicals in which two rings are aromatic. Examples of aryl are: phenyl, naphthyl, indanyl, 1,2-dihydronaphthenyl, 1,4-dihydronaphthenyl, indenyl, anthracenyl, phenanthrenyl or 1,2,3,4-tetrahydronaphthyl. Particular preference is given to $C_6$-$C_{10}$-aryl radicals, for example phenyl or naphthyl, very particular preference to $C_6$-aryl radicals, for example phenyl.

The aryl radicals may be unsubstituted or substituted by one or more further radicals. Suitable further radicals are selected from the group consisting of $C_1$-$C_{20}$-alkyl, $C_6$-$C_{30}$-aryl and substituents with donor or acceptor action, suitable substituents with donor or acceptor action being:

$C_1$-$C_{20}$-alkoxy, $C_6$-$C_{30}$-aryloxy, $C_1$-$C_{20}$-alkylthio, $C_6$-$C_{30}$-arylthio, $Si(R)_3$, halogen radicals, halogenated $C_1$-$C_{20}$-alkyl radicals, carbonyl (—CO(R)), carbonylthio (—C═O(SR)), carbonyloxy (—C═O(OR)), oxycarbonyl (—OC═O(R)), thiocarbonyl (—SC═O(R)), amino (—$NR_2$), OH, pseudohalogen radicals, amido (—C═O(NR)), —N(R)C═O(R), phosphonate (—P(O)(OR)$_2$, phosphate (—OP(O)(OR)$_2$), phosphine (—$PR_2$), phosphine oxide (—P(O)$R_2$), sulfate (—OS(O)$_2$OR), sulfoxide (—S(O)R), sulfonate (—S(O)$_2$OR), sulfonyl (—S(O)$_2$R), sulfonamide (—S(O)$_2$$NR_2$), $NO_2$, boronic esters (—OB(OR)$_2$), imino (—C═$NR_2$)), borane radicals, stannane radicals, hydrazine radicals, hydrazone radicals, oxime radicals, nitroso groups, diazo groups, vinyl groups, (═sulfonate) and boronic acid groups, sulfoximines, alanes, germanes, boroximes and borazines.

Preferred substituents with donor or acceptor action are selected from the group consisting of:

$C_1$- to $C_{20}$-alkoxy, preferably $C_1$-$C_6$-alkoxy, more preferably ethoxy or methoxy; $C_6$-$C_{30}$-aryloxy, preferably $C_6$-$C_{10}$-aryloxy, more preferably phenyloxy; $SiR_3$, where the three R radicals are preferably each independently substituted or unsubstituted alkyl or substituted or unsubstituted phenyl, halogen radicals, preferably F, Cl, Br, more preferably F or Cl, most preferably F, halogenated $C_1$-$C_{20}$-alkyl radicals, preferably halogenated $C_1$-$C_6$-alkyl radicals, most preferably fluorinated $C_1$-$C_6$-alkyl radicals, e.g. $CF_3$, $CH_2F$, $CHF_2$ or $C_2F_5$; amino, preferably dimethylamino, diethylamino or diphenylamino; OH, pseudohalogen radicals, preferably CN, SCN or OCN, more preferably CN, —C(O)O$C_1$-$C_4$-alkyl, preferably —C(O)OMe, P(O)$R_2$, preferably P(O)$Ph_2$, or $SO_2R_2$, preferably $SO_2Ph$.

R in the aforementioned groups is especially $C_1$-$C_{20}$-alkyl or $C_6$-$C_{30}$-aryl.

$C_1$-$C_6$-Alkylene-COO-alkyl, $C_1$-$C_6$-alkylene-O—CO-alkyl and $C_1$-$C_6$-alkylene-O—CO—O-alkyl derive from the above-described alkyl radicals through attachment to the $C_1$-$C_6$-alkylene-COO, $C_1$-$C_6$-alkylene-O—CO and $C_1$-$C_6$-alkylene-O—CO—O moieties, in which the $C_1$-$C_6$-alkylene units are preferably linear. Especially useful are $C_2$-$C_4$-alkylene units.

Arylalkyl is understood to mean especially aryl-$C_1$-$C_{20}$-alkyl groups. They derive from the alkyl and aryl groups detailed above through formal replacement of a hydrogen atom of the linear or branched alkyl chain by an aryl group. An example of a preferred arylalkyl group is benzyl.

Hetaryl is understood to mean unsubstituted or substituted heteroaryl radicals having from 5 to 30 ring atoms, which may be monocyclic, bicyclic or tricyclic, some of which can be derived from the aforementioned aryl, by virtue of at least one carbon atom in the aryl base skeleton being replaced by a heteroatom. Preferred heteroatoms are N, O and S. More preferably, the hetaryl radicals have from 5 to 13 ring atoms. The base skeleton of the heteroaryl radicals is especially preferably selected from systems such as pyridine and five-membered heteroaromatics such as thiophene, pyrrole, imidazole or furan. These base skeletons may optionally be fused to one or two six-membered aromatic radicals. Suitable fused heteroaromatics are carbazolyl, benzimidazolyl, benzofuryl, dibenzofuryl or dibenzothiophenyl. The base skeleton may be substituted at one, more than one or all substitutable positions, suitable substituents being the same as already specified under the definition of $C_6$-$C_{30}$-aryl. However, the hetaryl radicals are preferably unsubstituted. Suitable hetaryl radicals are, for example, pyridin-2-yl, pyridin-3-yl, pyridin-4-yl, thiophen-2-yl, thiophen-3-yl, pyrrol-2-yl, pyrrol-3-yl, furan-2-yl, furan-3-yl and imidazol-2-yl, and also the corresponding benzofused radicals, especially carbazolyl, benzimidazolyl, benzofuryl, dibenzofuryl or dibenzothiophenyl.

In the photoactive layers, component K1 may assume the role of the electron donor; correspondingly, component K2 is then assigned the role of the electron acceptor. Alternatively, component K1 may, however, also assume the role of the electron acceptor; correspondingly, component K2 then functions as the electron donor. The way in which the particular component acts depends on the energies of the HOMO and LUMO of component K1 in relation to the energies of the HOMO and LUMO of component K2. The compounds of component K1 are typically merocyanines, which typically appear as electron donors. This is the case especially when the components K2 used are rylene or fullerene derivatives, which then generally act as electron acceptors. However, these roles can be exchanged in the specific individual case. It should also be noted that component K2 may likewise obey the structural definition of component K1, such that one compound of the formula Ia, Ib, Ic or Id may assume the role of the electron donor and another compound of the formula Ia, Ib, Ic or Id the role of the electron acceptor.

Preferred compounds of the formulae Ia, Ib, Ic, Id, Ie, IIa and/or IIb for use in accordance with the invention in component K1 are notable in that, when n is 1, L is a moiety selected from the group of

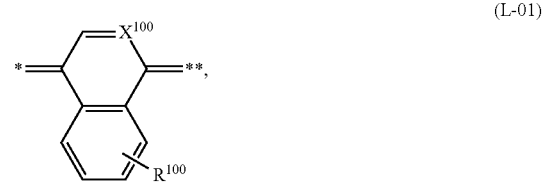

(L-01)

(L-02)

-continued
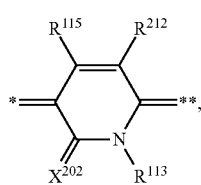
(L-03)
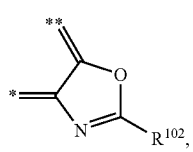
(L-04)
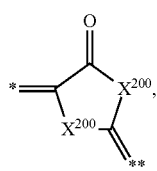
(L-05)
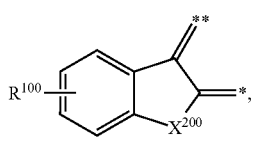
(L-06)
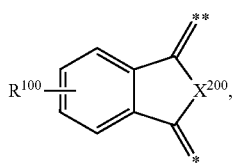
(L-07)
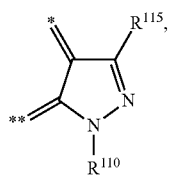
(L-08)
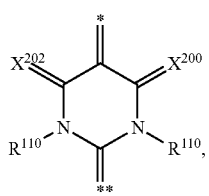
(L-09)
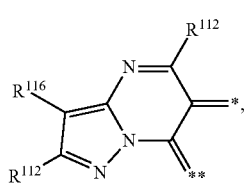
(L-10)
-continued
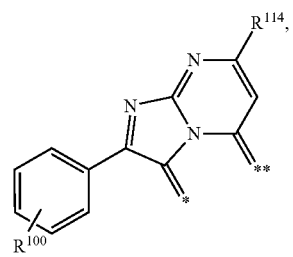
(L-11)
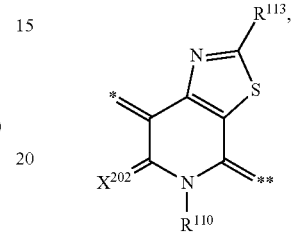
(L-12)
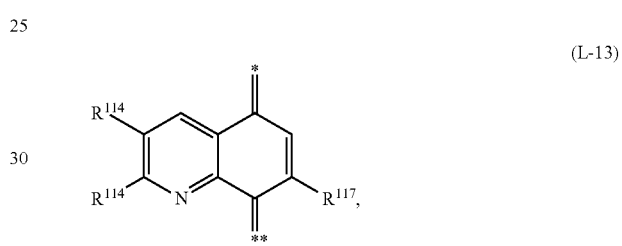
(L-13)
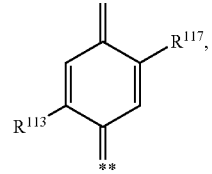
(L-14)
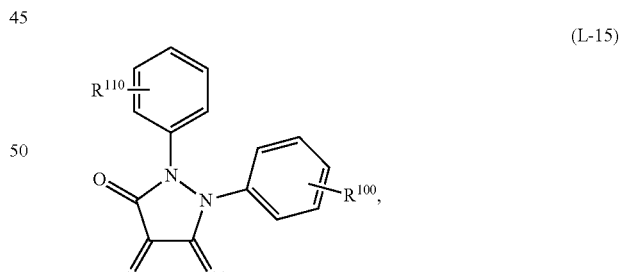
(L-15)
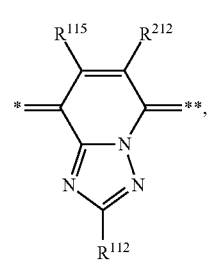
(L-16a)

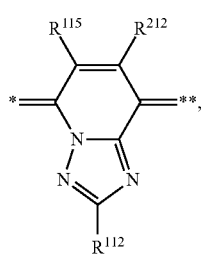 (L-16b)
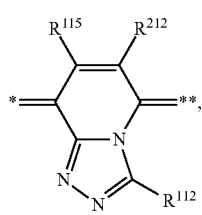 (L-17)
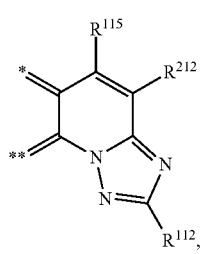 (L-18)
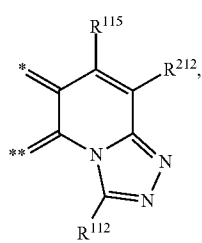 (L-19)
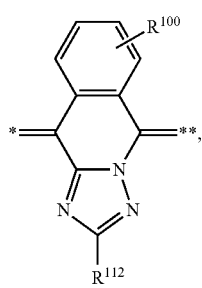 (L-20)
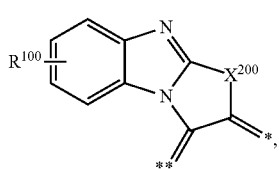 (L-21)
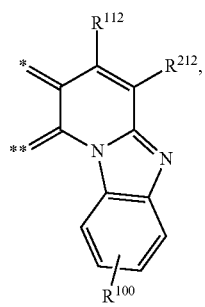 (L-22)
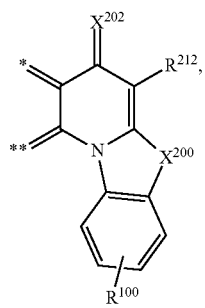 (L-23)
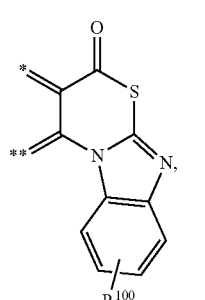 (L-24)
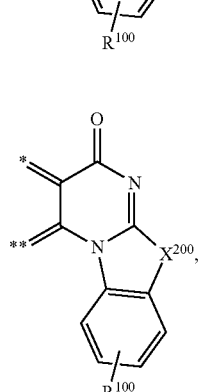 (L-25)
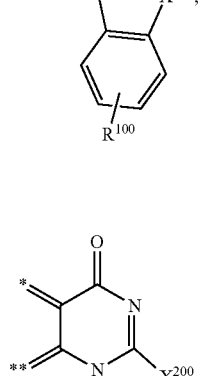 (L-26)

-continued

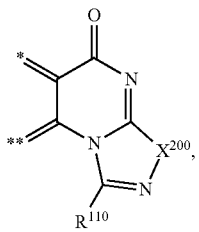
(L-27)

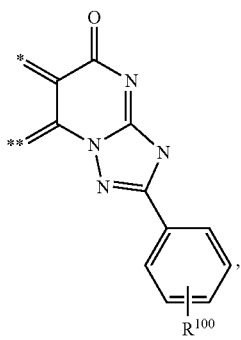
(L-28)

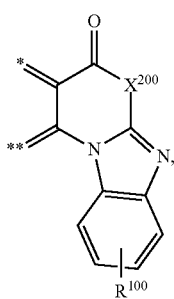
(L-29)

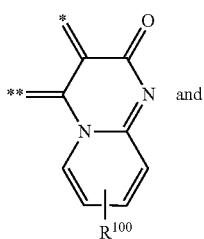
(L-30)

and

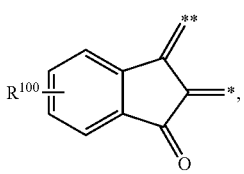
(L-31)

in which
$R^{102}$ is arylalkyl, aryl or hetaryl,
$R^{112}$ is H, alkyl, $C_1$-$C_6$-alkylene-COO-alkyl, $C_1$-$C_6$-alkylene-O—CO-alkyl, $C_1$-$C_6$-alkylene-O—CO—O-alkyl, cycloalkyl, arylalkyl, aryl, $OR^{110}$ or $SR^{110}$,
$R^{113}$ is H, alkyl, $C_1$-$C_6$-alkylene-COO-alkyl, $C_1$-$C_6$-alkylene-O—CO-alkyl, $C_1$-$C_6$-alkylene-O—CO—O-alkyl, cycloalkyl, arylalkyl, aryl, hetaryl, NH-aryl, N(aryl)$_2$, NHCO—$R^{101}$ or N(CO—$R^{101}$)$_2$, $R^{114}$ is H, alkyl or partly fluorinated or perfluorinated alkyl, $C_1$-$C_6$-alkylene-COO-alkyl, $C_1$-$C_6$-alkylene-O—CO-alkyl or $C_1$-$C_6$-alkylene-O—CO—O-alkyl,
$R^{115}$ is H, alkyl, partly fluorinated or perfluorinated alkyl, $C_1$-$C_6$-alkylene-COO-alkyl, $C_1$-$C_6$-alkylene-O—CO-alkyl, $C_1$-$C_6$-alkylene-O—CO—O-alkyl, cycloalkyl, arylalkyl, aryl, NHCO—$R^{101}$ or N(CO—$R^{101}$)$_2$,
$R^{116}$ is H, alkyl, $C_1$-$C_6$-alkylene-COO-alkyl, $C_1$-$C_6$-alkylene-O—CO-alkyl, $C_1$-$C_6$-alkylene-O—CO—O-alkyl, cycloalkyl, arylalkyl, aryl, $CO_2R^{110}$ or CN
$R^{117}$ is H, alkyl, $C_1$-$C_6$-alkylene-COO-alkyl, $C_1$-$C_6$-alkylene-O—CO-alkyl, $C_1$-$C_6$-alkylene-O—CO—O-alkyl, cycloalkyl, arylalkyl, aryl, $OR^{110}$, $SR^{110}$ halogen or hetaryl,
$R^{212}$ is H, CN, $CONR^{110}$ or $COR^{101}$,
$X^{202}$ is twice H, O or S, where * and  denote the attachment to the $X^{100}$ or W unit, the carbon chains of the alkyl and cycloalkyl radicals may be interrupted by one or two nonadjacent oxygen atoms, and the remaining variables are each as defined in claim 1, and the variables mentioned above and also in claim 1**, where they occur more than once, may be the same or different.

Further mixtures for use with preference, also taking account of the above-described preferences, are notable in that component K2 comprises one or more compounds selected from the group of a) fullerenes and fullerene derivatives, b) polycyclic aromatic hydrocarbons and derivatives thereof, especially naphthalene and derivatives thereof, rylenes, especially perylene, terrylene and quaterrylene, and derivatives thereof, acenes, especially anthracene, tetracene, especially rubrene, pentacene and derivatives thereof, pyrene and derivatives thereof, coronene and hexabenzocoronene and derivatives thereof, c) quinones, quinodimethanes and quinonediimines and derivatives thereof, d) phthalocyanines and subphthalocyanines and derivatives thereof, e) porphyrins, tetraazaporphyrins and tetrabenzoporphyrins and derivatives thereof, f) thiophenes, oligothiophenes, fused thiophenes such as thienothiophene and bithienothiophene, and derivatives thereof, g) thiadiazoles and derivatives thereof, h) carbazoles and triarylamines and derivatives thereof, i) indanthrones, violanthrones and flavanthones and derivatives thereof, j) fulvalenes, tetrathiafulvalenes and tetraselenafulvalenes and derivatives thereof, and k) diketopyrrolopyrroles and derivatives thereof.

More particularly, inventive use is found, also taking account of the above-described preferences, by mixtures which are notable in that component K2 comprises one or more fullerenes and/or fullerene derivatives.

Useful easily obtainable fullerene derivatives include especially compounds of the general formula k2

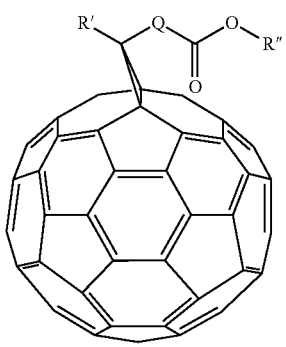

in which

Q is $C_1$-$C_{10}$-alkylene,

R' is aryl or arylalkyl and

R" is alkyl.

For definitions of aryl, arylalkyl and alkyl, reference is made to the statements already made above.

$C_1$-$C_{10}$-Alkylene is especially understood to mean a linear chain —$(CH_2)_m$— where m is 1, 2, 3, 4, 5, 6, 7, 8, 9 or 10.

More particularly, use is found in accordance with the invention by those fullerene derivatives in which R' is a $C_1$-$C_4$-alkyl radical, especially a methyl radical, Q is a propylene chain —$(CH_2)_3$— and R" is an optionally substituted phenyl or 2-thienyl. The fullerene derivative is preferably [6,6]-phenyl-$C_{61}$-butyric acid methyl ester ("PCBM").

Particular preference is given to using, also taking account of the above-mentioned preferences, mixtures in which component K2 comprises one or more fullerenes.

Possible fullerenes include $C_{60}$, $C_{70}$, $C_{76}$, $C_{80}$, $C_{82}$, $C_{84}$, $C_{86}$, $C_{90}$ and $C_{94}$, especially $C_{60}$ and $C_{70}$. An overview of fullerenes which can be used in accordance with the invention is given, for example, by the monograph A. Hirsch, M. Brettreich, "Fullerenes: Chemistry and Reactions", Wiley-VCH, Weinheim 2005.

More particularly, component K2 is a C60 fullerene of the formula k2

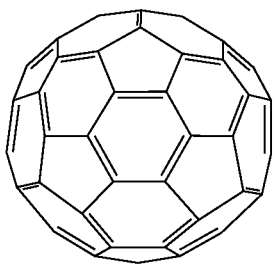

(k2)

The mixtures for use in accordance with the invention are notable in that component K1 is present in a proportion of from 10 to 90% by mass, especially from 20 to 80% by mass, and component K2 in a proportion of from 90 to 10% by mass, especially from 80 to 20% by mass, the proportions of components K1 and K2, based in each case on the total mass of components K1 and K2, adding up to 100% by mass.

As a result of the preparation, it is possible in the individual case that not a compound of the formula Ia, Ib, Ic, Id, Ie, IIa or IIb shown explicitly but a compound isomeric thereto is obtained, or else that mixtures of isomers are obtained.

According to the invention, the isomeric compounds of the formulae Ia, Ib, Ic, Id, Ie, IIa and IIb and the isomers of the corresponding preferred compounds and mixtures of isomers shall accordingly also be included.

The synthesis of the compounds of the general formulae Ia, Ib, Ic, Id, Ie, IIa and IIb and are known to those skilled in the art or can be prepared based on known synthesis methods.

For example, with regard to corresponding syntheses, the following publications should be cited:

DE 195 02 702 A1, EP 416 434 A2, EP 509 302 A1, EP 291 853 A2, U.S. Pat. Nos. 5,147,845, 5,703,238;

"ATOP Dyes. Optimization of a Multifunctional Merocyanine Chromophore for High Refractive Index Modulation in Photorefractive Materials", F. Würthner, S. Yao, J. Schilling, R. Wortmann, M. Redi-Abshiro, E. Mecher, F. Gallego-Gomez, K. Meerholz, J. Am. Chem. Soc. 2001, 123, 2810-2814;

"Merocyaninfarbstoffe im Cyaninlimit: eine neue Chromophorklasse für photorefraktive Materialien; Merocyanine Dyes in the Cyanine Limit: A New Class of Chromophores for Photorefractive Materials", F. Würthner, R. Wortmann, R. Matschiner, K. Lukaszuk, K. Meerholz, Y. De Nardin, R. Bittner, C. Bräuchle, R. Sens, Angew. Chem. 1997, 109, 2933-2936; Angew. Chem. Int. Ed. Engl. 1997, 36, 2765-2768;

"Electrooptical Chromophores for Nonlinear Optical and Photorefractive Applications", S. Beckmann, K.-H. Etzbach, P. Krämer, K. Lukaszuk, R. Matschiner, A. J. Schmidt, P. Schuhmacher, R. Sens, G. Seybold, R. Wortmann, F. Würthner, Adv. Mater. 1999, 11, 536-541;

"DMF in Acetic Anhydride: A Useful Reagent for Multiple-Component Syntheses of Merocyanine Dyes", F. Würthner, Synthesis 1999, 2103-2113;

Ullmanns' Encyclopedia of industrial Chemistry, Vol. 16, 5$^{th}$ Edition (Ed. B. Elvers, S. Hawkins, G. Schulz), VCH 1990 in the chapter "Methine Dyes and Pigments", p. 487-535 by R. Raue (Bayer AG).

More particularly, with regard to the synthesis of the compounds of the formulae Ia, Ib, Ic, Id, Ie, IIa and IIb, the following publications should be mentioned:

T. Zimmermann, J. Heterocycl. Chem., 2000, 37, 1571; (compounds Ia)

T. Zimmermann and O. Brede, J. Heterocycl. Chem., 2004, 41, 103; (compounds Ia)

M. Kullich, H. Balli, Helvetica Chimica Acta, 70, 1987; 1583-1595; (compounds Ib)

A. V. Kulinich et al, Russian Chemical Bulletin, 54, 12, 2005; 2820-2830; (compounds Ib)

M. Henary et al. Journal of Heterocyclic Chemistry, 46, 1, 2009; 84-87; (compounds Ib)

H. Fritz, Chemische Berichte 92, 1959, S. 1809-1817; (compounds Ie)

Tsotinis et al. Farmaco, 56, 9, 2001; 725-730; (compounds IIa)

FR 1520818 (Eastman Kodak Co.); (compounds IIb)

E. Desarbre et al, Heterocycles 41, 9, 1995; 1987-1998; (compounds IIb)

Compounds of the general formula Ia usable in accordance with the invention are shown by way of example below:

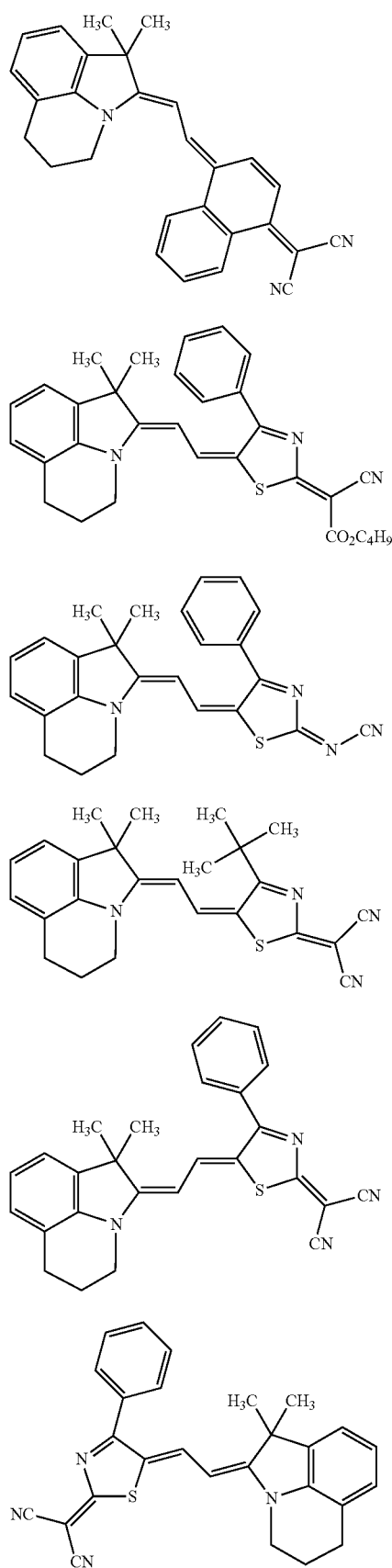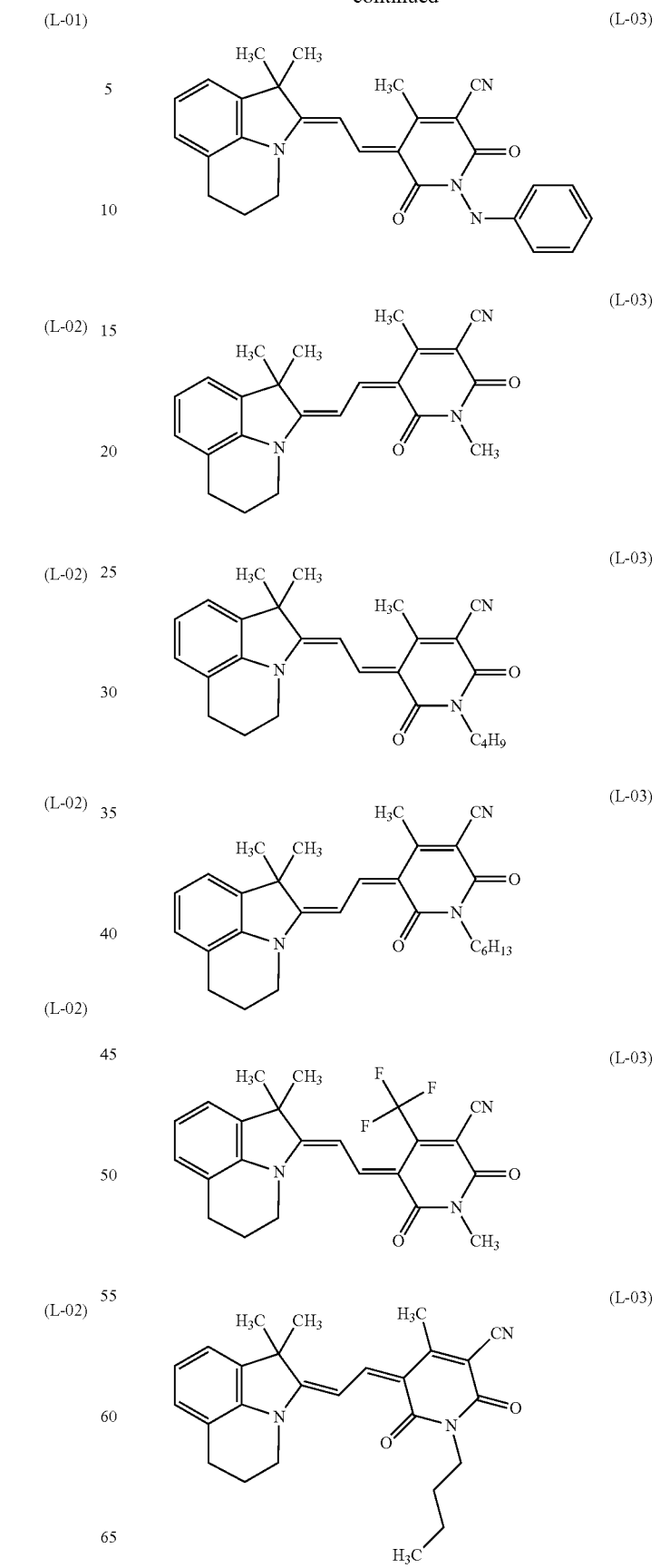

-continued
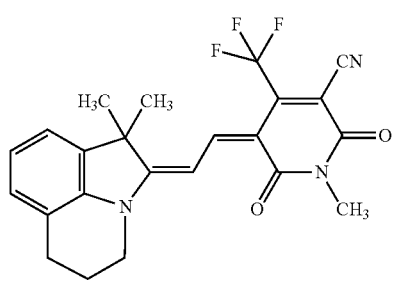 (L-03)
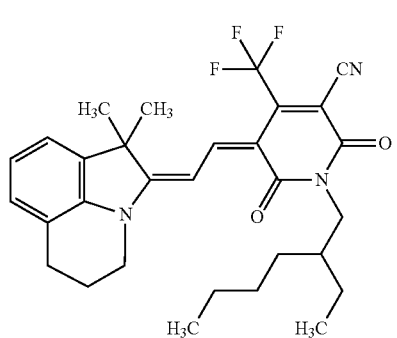 (L-03)
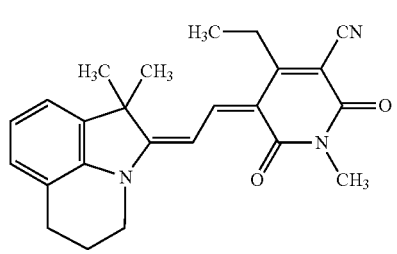 (L-03)
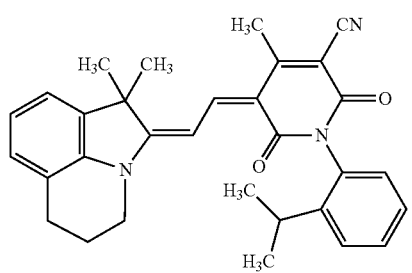 (L-03)
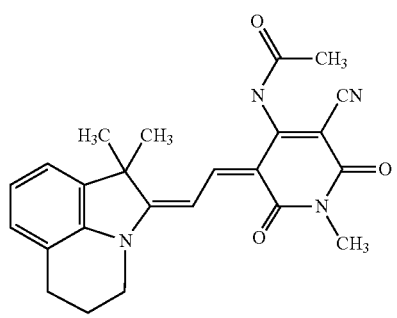 (L-03)
-continued
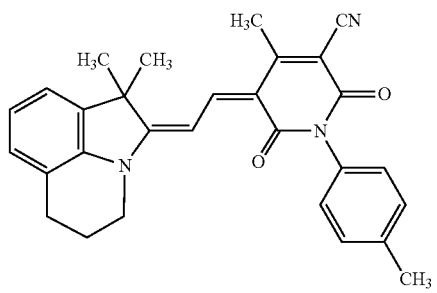 (L-03)
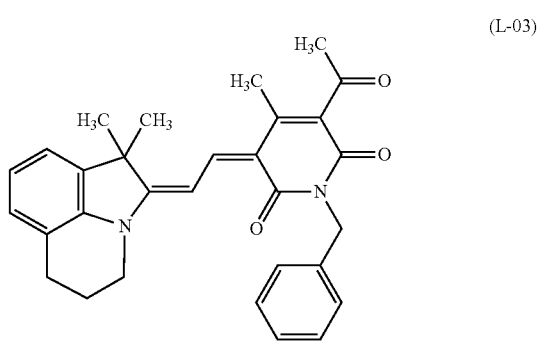 (L-03)
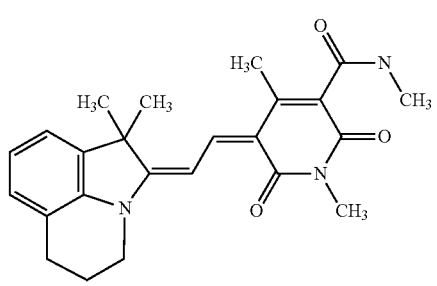 (L-03)
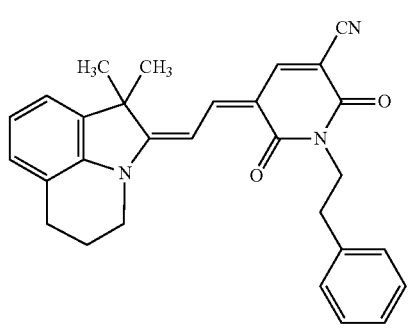 (L-03)
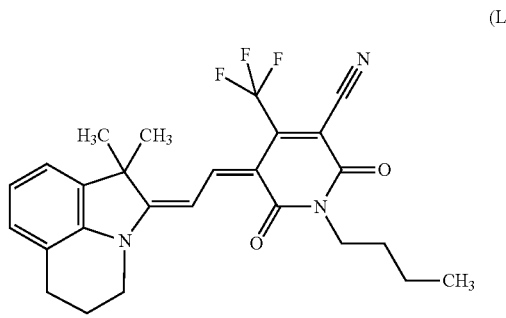 (L-03)

-continued
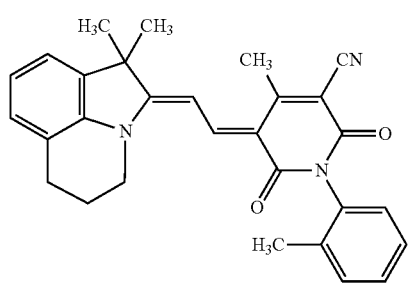 (L-03)
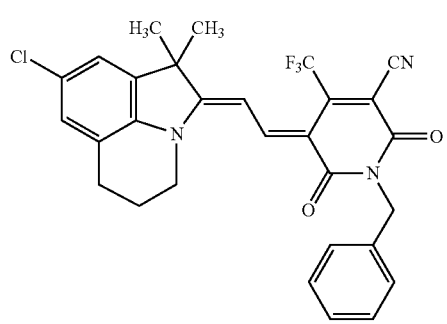 (L-03)
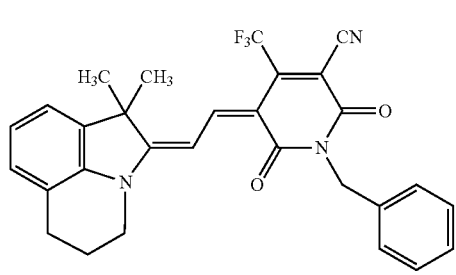 (L-03)
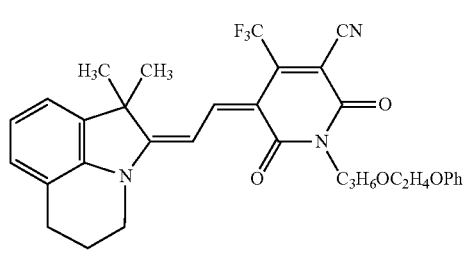 (L-03)
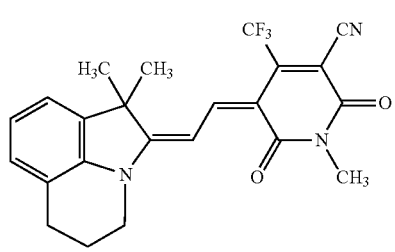 (L-03)
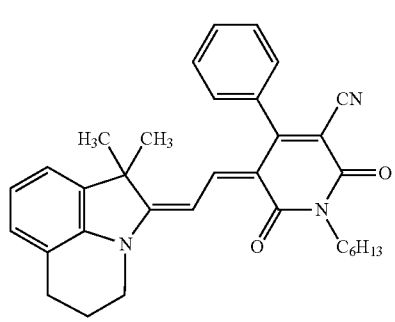 (L-03)
-continued
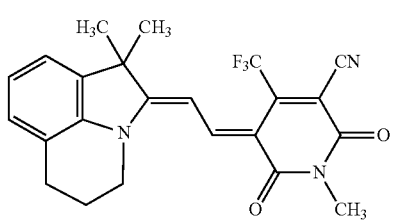 (L-03)
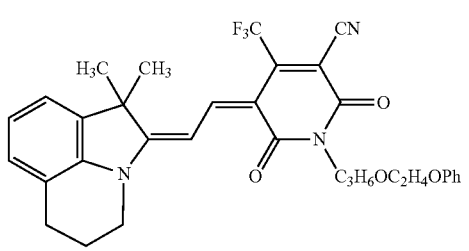 (L-03)
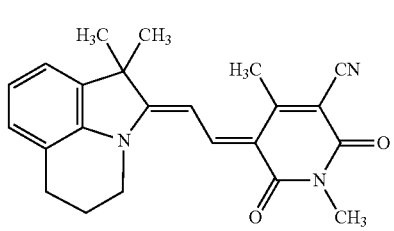 (L-03)
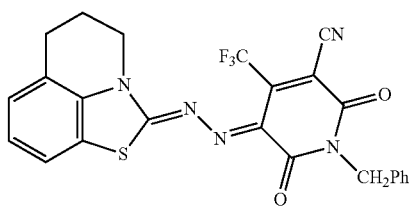 (L-03)
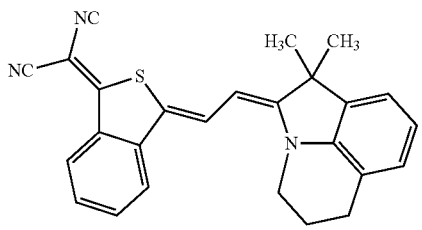 (L-07)
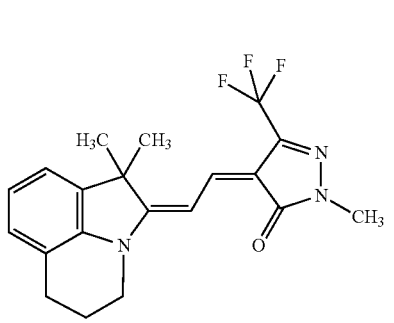 (L-08)

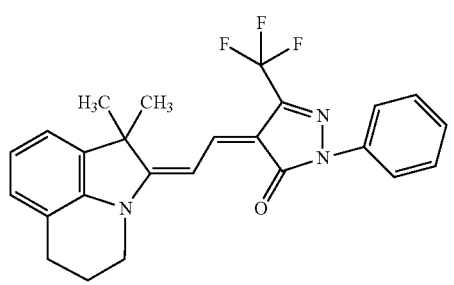
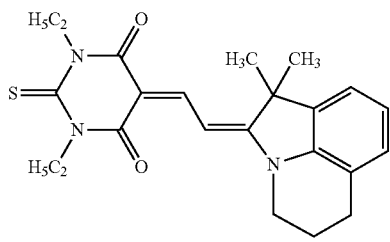
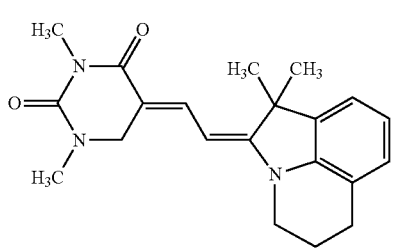
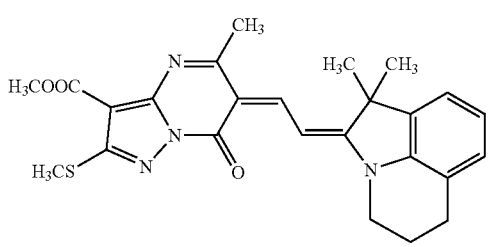
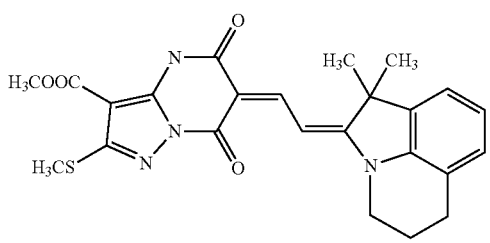
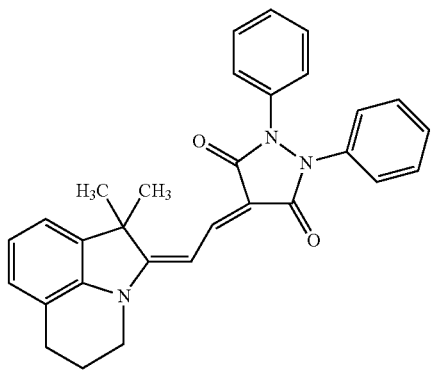

(L-16)
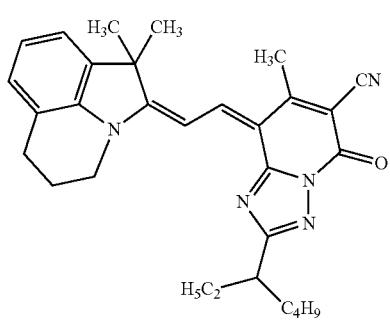
(L-16)
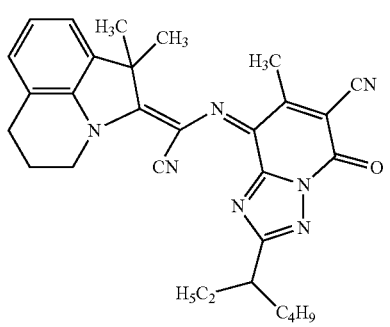
(L-17)
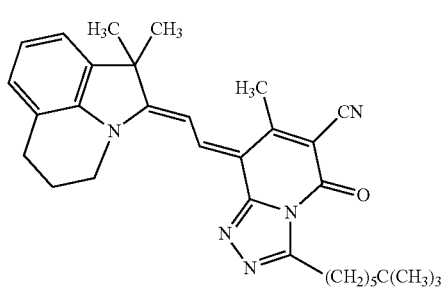
(L-18)
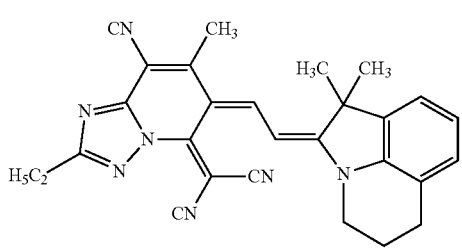
(L-19)
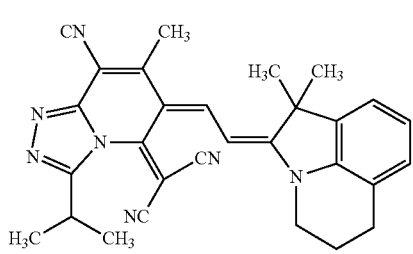
(L-20)
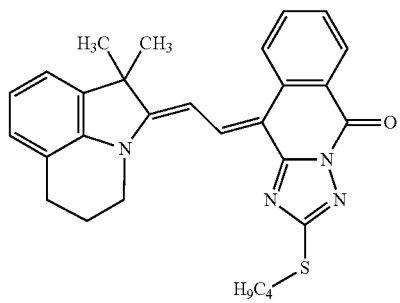
(L-31)
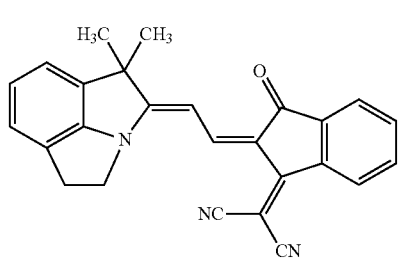
(L-32)
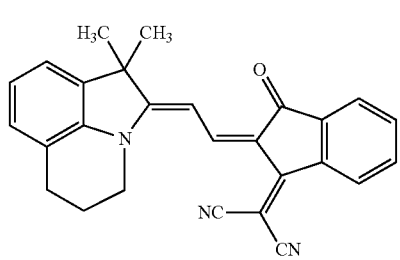
Compounds of the formula Ia in which the L unit is absent (n=0) are shown by way of example below:
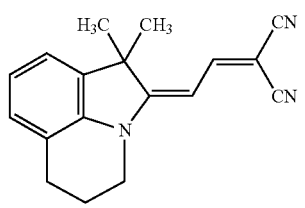
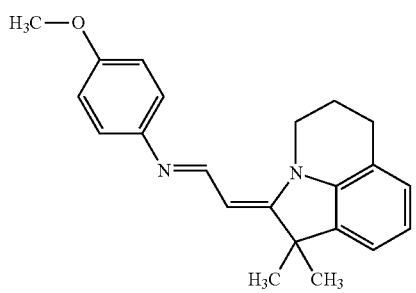
A compound of the formula Ib in which the L unit is absent (n=0) is shown by way of example below:

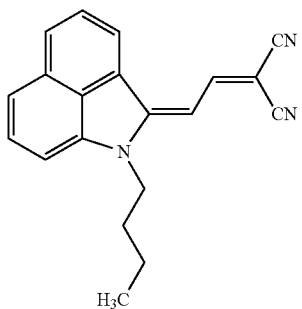 [SMILES: CCCCn1/c(=C/C=C(C#N)C#N)c2cccc3cccc1c32]
Further compounds of the formula Ib are:
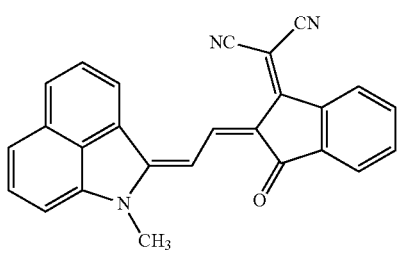
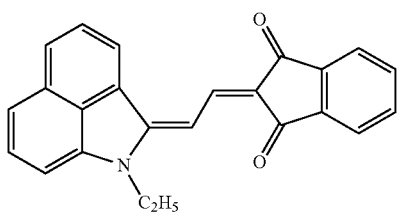
A compound of the formula Ie is shown below by way of example in the S and R configurations thereof:
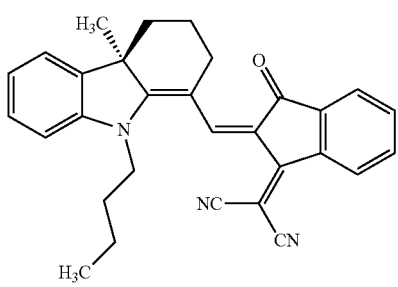
R isomer
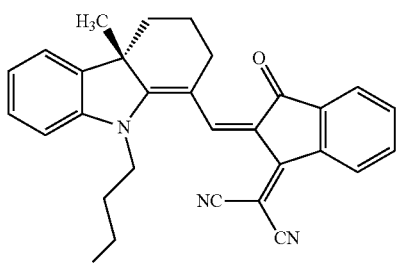
S isomer
Further compounds of the formula Ie are shown below:
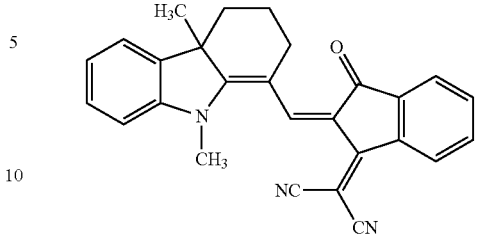
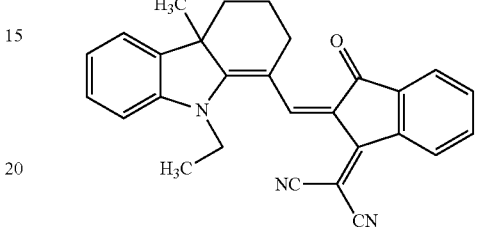
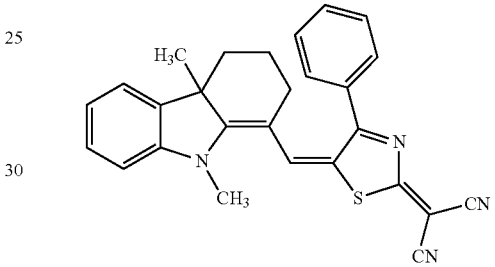
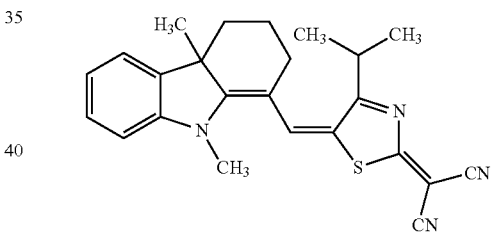
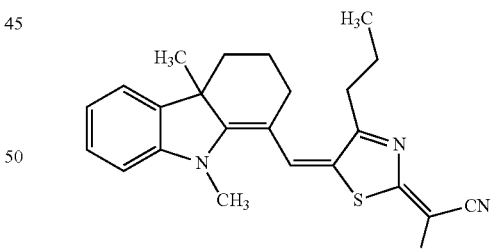
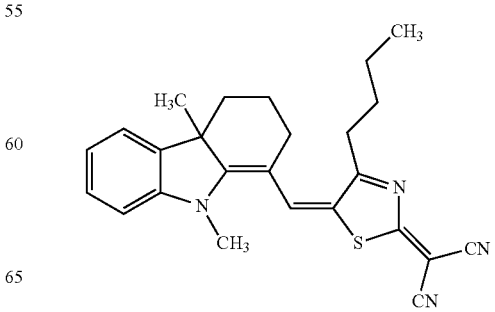
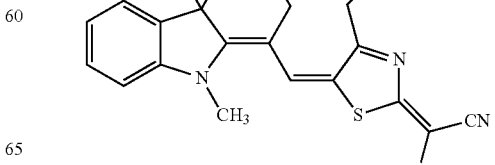

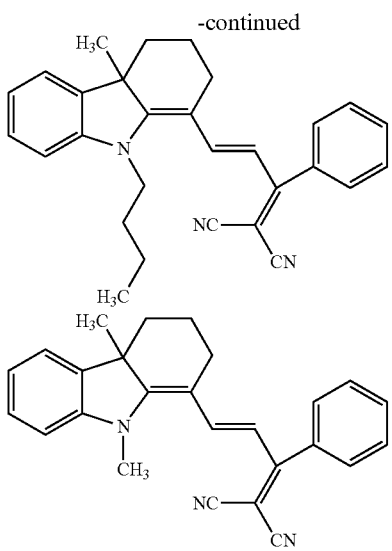

The following compounds are also cited by way of example:
for IIa:

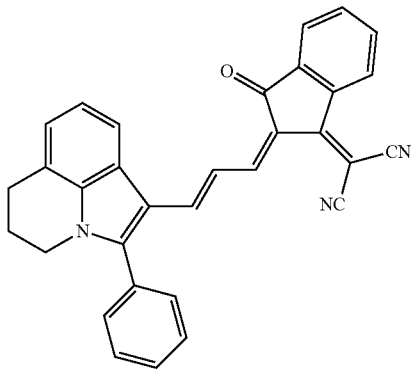 [SMILES: N#CC(C#N)=C1/C(=C/C=C/c2c(-c3ccccc3)n3c4c(cccc24)CCC3)C(=O)c2ccccc21]

and for IIb:

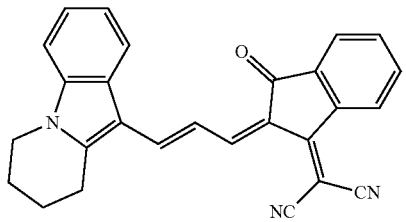 [SMILES: N#CC(C#N)=C1/C(=C/C=C/c2c3n(c4ccccc24)CCCC3)C(=O)c2ccccc21]

Also claimed in the context of the present invention, inter alia, is a process for producing photoactive layers, wherein one or more compounds of the general formulae Ia, Ib, Ic, Id Ie, IIa and/or IIb of component K1 shown at the outset, also taking account of their preferences, and one or more compounds of component K2, likewise taking account of their preferences, are deposited on a substrate successively, simultaneously or in alternating sequence by vacuum sublimation.

More particularly, the process is notable in that component K1 is present deposited on the substrate in a proportion of from 10 to 90% by mass, especially from 20 to 80% by mass, and component K2 in a proportion of from 90 to 10% by mass, especially from 80 to 20% by mass, where the proportions of components K1 and K2, based in each case on the total mass of components K1 and K2, add up to 100% by mass.

Also claimed in the context of the present invention are organic solar cells and organic photodetectors which comprise photoactive layers which have been produced using the above-described mixtures comprising components K1 and K2, or using the preferred embodiments of the mixtures which have likewise been described above.

Organic solar cells usually have a layer structure and comprise generally at least the following layers: electrode, photoactive layer and counterelectrode. These layers are generally present on a substrate customary for this purpose. Suitable substrates are, for example, oxidic materials, for example glass, quartz, ceramic, $SiO_2$, etc., polymers, for instance polyvinyl chloride, polyolefins, e.g. polyethylene and polypropylene, polyesters, fluoropolymers, polyamides, polyurethanes, polyalkyl (meth)acrylates, polystyrene and mixtures and composites thereof, and combinations of the substrates listed above.

Suitable materials for one electrode are especially metals, for example the alkali metals Li, Na, K, Rb and Cs, the alkaline earth metals Mg, Ca and Ba, Pt, Au, Ag, Cu, Al, In, metal alloys, for example based on Pt, Au, Ag, Cu, etc., and specific Mg/Ag alloys, but additionally also alkali metal fluorides such as LiF, NaF, KF, RbF and CsF, and mixtures of alkali metal fluorides and alkali metals. The electrode used is preferably a material which essentially reflects the incident light. Examples include metal films composed of Al, Ag, Au, In, Mg, Mg/Al, Ca, etc.

The counterelectrode consists of a material essentially transparent toward incident light, for example ITO, doped ITO, ZnO, $TiO_2$, Cu, Ag, Au and Pt, the latter materials being present in correspondingly thin layers.

In this context, an electrode/counterelectrode shall be considered to be "transparent" when at least 50% of the radiation intensity in the wavelength range in which the photoactive layer absorbs radiation is transmitted. In the case of a plurality of photoactive layers, an electrode/counterelectrode shall be considered to be "transparent" when at least 50% of the radiation intensity in the wavelength ranges in which the photoactive layers absorb radiation is transmitted.

In addition to the photoactive layer, it is possible for one or more further layers to be present in the inventive organic solar cells and photodetectors, for example electron transporting layers ("ETLs") and/or hole transporting layers ("HTLs") and/or blocking layers, e.g. exciton blocking layers ("EBLs") which typically do not absorb the incident light, or else layers which serve as charge transport layers and simultaneously improve the contacting to one or both electrodes of the solar cell. The ETLs and HTLs may also be doped, so as to give rise to cells of the p-i-n type, as described, for example, in the publication by J. Drechsel et al., Thin Solid Films 451-452 (2004), 515-517.

Customary structures A), B) and C) of solar cells are described below:
A) Two layer structure:
  The structure comprises the following layers:
  16 metal electrode (cathode)
  (15 optional EBL and/or ETL)
  14 electron acceptor layer
  13 electron donor layer
  (12 optional HTL)
  11 transparent electrode (anode)
  Layer 11 is a transparent conductive layer, for example ITO, FTO or ZnO, which has optionally been pretreated, for example with oxygen plasma, UV/ozone purging, etc. This layer must, on the one hand, be sufficiently thin as to allow only low light absorption, but, on the other hand, thick enough to ensure satisfactory lateral charge transport within the layer. Typically, the thickness of the layer is 20-200 nm, and it is applied to a substrate such as glass or a flexible polymer (for example PET).

Layer 12 consists of one or more HTLs with a high ionization potential (>5.0 eV, preferably 5.5 eV). This layer may consist either of organic material, such as poly(3,4-ethylenedioxythiophene) doped with poly(styrenesulfonate)(PEDOT-PSS), or, for example, of Ir-DPBIC (tris-N,N'-diphenylbenzimidazol-2-ylideneiridium(III)), N,N'-diphenyl-N,N'-bis(3-methylphenyl)-1,1'-diphenyl-4,4'-diamine (α-NPD) and/or 2,2',7,7'-tetrakis(N,N-di-p-methoxyphenylamine)-9,9'-spirobifluorene (spiro-MeOTAD), or of inorganic material, such as $WO_3$, $MoO_3$, etc. Typically, the layer thickness is 0-150 nm. In the case that layer 12 is formed from organic material, it can be admixed with a p-dopant whose LUMO energy is within the same energy range as or lower than the HOMO of the HTL. Such dopants are, for example, 2,3,5,6-tetrafluoro-7,7,8,8-tetracyanoquinodimethane ($F_4TCNQ$), $WO_3$, $MoO_3$, or the substances described in document WO 2007/071450 A1.

Layer 13 consists of the electron donor. Typically, the layer should be sufficiently thick that it absorbs a maximum amount of light, but on the other hand be sufficiently thin to be able to effectively dissipate the charges formed. In general, the thickness is 5-200 nm.

Layer 14 consists of the electron acceptor. As for layer 13, the thickness here too should be sufficient to absorb as much light as possible, but, on the other hand, the charges formed must be dissipated effectively. This layer typically likewise has a thickness of 5-200 nm.

Layer 15 is an EBL/ETL and should have a greater optical band gap than the materials of layer 14, in order to reflect the excitons, but nevertheless still to possess sufficient electron transport properties. Suitable compounds are 2,9-dimethyl-4,7-diphenyl-1,10-phenanthroline (BCP), 4,7-diphenyl-1,10-phenanthroline (Bphen), 1,3-bis[2-(2,2'-bipyridin-6-yl)1,3,4-oxadizo-5-yl]benzene (BPY-OXD), ZnO, $TiO_2$ etc. In the case of an organic layer, this can be provided with an n-dopant whose HOMO has similar or lower energy than the LUMO of the electron transporting layer. Suitable materials are $Cs_2CO_3$, Pyronin B (PyB), described, for example, in document WO 2003/070822 A2, Rhodamine B, described, for example, in document WO 2005/036667 A1, cobaltocene and the compounds mentioned in document WO 2007/071450 A1. The layer thickness is typically 0-150 nm.

Layer 16 (cathode) consists of a material with a low work function. For example, it comprises metals such as Ag, Al, Ca, Mg or mixtures thereof. The layer thickness is typically 50-1000 nm and should be selected sufficiently such that most light in the wavelength range of 350-1200 nm is reflected.

The customary pressures during the gas phase deposition are between $10^{-4}$ and $10^{-9}$ mbar. The deposition rate varies generally between 0.01 nm/second and 10 nm/second. The temperature of the substrate during the deposition can be varied within a temperature range between −100° C. and 200° C., in order to influence the morphology of the corresponding layer in a controlled manner. The deposition rate is typically between 0.1 nm/second and 2.0 nm/second.

For the deposition of the layers, it is likewise possible to use the process described in WO 1999/025894 A1.

The deposition of the active layer (layer 13 and 14) or the completion of the complete cell, i.e. the deposition of layer 16, may be followed by a heat treatment at from 60° C. to 100° C. for the duration of a few minutes up to several hours, in order to achieve more intimate contact of the layers. For this purpose, it is equally possible to undertake a treatment for the corresponding duration with solvent vapor, for example of toluene, xylene, chloroform, N-methylpyrrolidone, dimethylformamide, ethyl acetate, chlorobenzene and dichloromethane or other solvents.

B) Bulk heterojunction (BHJ) construction:
 The structure comprises the following layers:
 26 metal electrode (cathode)
 (25 optional EBL and/or ETL)
 24 ETL
 23 electron acceptor-electron donor layer
 (22 optional HTL)
 21 transparent electrode (anode)

Layers 21 and 22 correspond to layers 11 and 12 from construction A).

Layer 23 can be produced by coevaporation or by solution processing with customary solvents—these will be discussed below. The proportion of the electron donor in both cases is preferably from 10 to 90% by mass, especially from 20 to 80% by mass. The proportion of electron acceptor is the supplementary proportion to 100% by mass. Here too, the layer must be sufficiently thick that light is absorbed sufficiently, but still sufficiently thin that the charge carriers can be dissipated effectively. Typically, the layer is 5-500 nm thick.

The ETL layer 24 may consist of one or more layers of materials with a low LUMO energy (<3.5 eV). These layers may consist either of organic compounds, such as C60-fullerene, BCP, Bphen or BPY-OXD, or of inorganic compounds, such as ZnO, $TiO_2$ etc., and are generally between 0 nm-150 nm thick. In the case of organic layers, these may be admixed with the dopants already mentioned above.

Layers 25 and 26 correspond to layers 15 and 16 from construction A). Equally, the deposition rates and aftertreatments correspond to those from construction A).

C) Tandem cell
 The structure comprises the following layers:
 36 metal electrode (cathode)
  (additional recombination layers and subcells)
 34 2nd subcell
 33 recombination layer
 32 1st subcell
 31 transparent electrode (anode)

Tandem cells comprise two or more subcells, which are usually connected in series, with recombination layers arranged between the individual subcells.

Layer 31 corresponds, in terms of construction, to the aforementioned layers 11 and 21 from constructions A) and B).

Layers 32 and 34 are individual subcells and correspond, in terms of function, to individual cells as under constructions A) and B), with the difference that they do not comprise electrodes 11/16 or 21/26. The subcells therefore consist of layers 12 to 15 of construction A) or 22 to 25 of construction B).

The subcells may, as component K1 or K2, either all comprise merocyanines, or one subcell may comprise one or more merocyanines and the remaining subcells may comprise combinations of other materials, for example C60-fullerene/Zn-phthalocyanine, oligothiophene (for example DCV5T)/C60-fullerene (as described in WO 2006/092134 A1), or one of the subcells is a dye-sensitized solar cell (DSSC) or a polymer cell, for example in the P3HT/PCBM combination. In addition, both cells of the A) construction and of the B) construction may be present as subcells. In the cases mentioned, the most favorable case is when the combination of the materials/subcells is selected such that the light absorptions of the subcells do not overlap too greatly, but overall cover the spectrum of sunlight, which leads to an increase in the power yield. Taking account of optical interferences which take place in the cell, it is additionally advisable to place a subcell with absorption within a shorter wavelength range close to the electrode 36 than a subcell with absorption in the longer wavelength range.

The recombination layer 33 brings about the recombination of oppositely charged charge carriers in adjacent subcells. The active constituents in the recombination layer may be metal clusters, for example of Ag or Au, or the recombination layer may consist of a combination of highly doped n- and p-conductive layers (as described, for example, in WO 2004/083958 A2).

In the case of use of metal clusters, typically layer thicknesses of 0.5-20 nm are established, and, in the case of the combined doped layers, thicknesses of 5-150 nm. Further subcells may be applied to the subcell 34, in which case further recombination layers, such as layer 33, must likewise be present.

The material for the electrode 36 depends on the polarity of the subcells. In the case of normal polarity, the metals with a low work function already mentioned, for example Ag, Al, Mg and Ca, are useful. In the case of inverted polarity, typically materials with a high work function are used, for example Au, Pt, PEDOT-PSS.

In the case of tandem cells comprising subcells connected in series, the component voltages are additive, but the overall current is limited by the subcell having the lowest current intensity/current density. The individual subcells should therefore be optimized such that their individual current intensities/current strengths have similar values.

The construction of organic solar cells is additionally described, for example, in documents WO 2004/083958 A2, US 2005/0098726 A1 and US 2005/0224905 A1, which are fully incorporated here by reference.

Photodetectors have essentially a construction analogous to organic solar cells, but are operated with a suitable bias voltage which generates an appropriate current flow as a measurement response under the action of radiation energy.

The photoactive layers can be processed from solution. In this case, components K1 and K2 may already be dissolved together, but may also be present separately as a solution of component K1 and a solution of component K2, the corresponding solutions in the latter case being mixed shortly before the application to the underlying layer. The concentrations of components K1 and K2 generally amount to a few g/l to a few tens of g/l of solvent.

Suitable solvents are all liquids which evaporate without residue and have a sufficient solubility for components K1 and K2. Useful examples here include aromatic compounds, for instance benzene, toluene, xylene, mesitylene, chlorobenzene or dichlorobenzene, trialkylamines, nitrogen-containing heterocycles, N,N-disubstituted aliphatic carboxamides, for instance dimethylformamide, diethylformamide, dimethylacetamide or dimethylbutyramide, N-alkyllactams, for instance N-methylpyrrolidone, linear and cyclic ketones, for instance methyl ethyl ketone, cyclopentanone or cyclohexanone, cyclic ethers, for instance tetrahydrofuran, or alcohols, for instance methanol, ethanol, propanol, isopropanol or butanol.

In addition, it is also possible for mixtures of the aforementioned solvents to find use.

Suitable methods of applying the inventive photoactive layers from the liquid phase are known to those skilled in the art. An advantageous method has been found here, more particularly, to be processing by means of spin-coating, since the thickness of the photoactive layer can be controlled in a simple manner by the amount and/or concentration of the solution used and the rotation speed and/or rotation time. The solution is generally processed at room temperature.

Preferably, however, components K1 and K2 are deposited from the gas phase, especially by vacuum sublimation. Since the compounds of the formulae Ia, Ib, Ic, Id, Ie, IIa and/or IIb can generally be purified by sublimation, it is already possible to derive start parameters for the gas phase deposition therefrom. Typically, the temperatures employed for the deposition are between 100 and 200° C., but they may also, according to the stability of the compounds of components K1 and K2, be increased into a range from 300 to 400° C.

Also claimed in the context of the present invention are mixtures which comprise, as components, one or more of the compounds, cited at the outset, of the general formulae Ia, Ib, Ic, Id, Ie, IIa and/or IIb of component K1, also taking account of the preferences detailed, and one or more compounds of component K2, likewise taking account of the preferences detailed therefor.

More particularly, the inventive mixtures are notable in that component K1 is present in a proportion of 10 to 90% by mass, especially 20 to 80% by mass, and component K2 in a proportion of 90 to 10% by mass, especially 80 to 20% by mass, where the proportions of components K1 and K2, based in each case on the total mass of components K1 and K2, add up to 100% by mass.

The invention is illustrated in detail hereinafter with reference to the examples which should not be interpreted as a restriction of the scope of the invention.

EXAMPLES

I. Synthesis of Compounds for Use in Accordance with the Invention:

Compounds Ia-1 to Ia-4 corresponding to the general formula Ia:

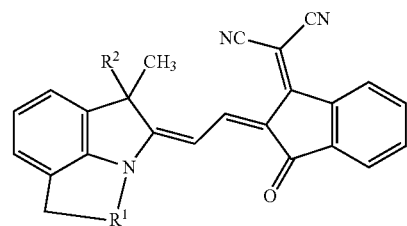

Ia-1: $R^1 = CH_3$; $R^2 = CH_3$
Ia-2: $R^1 = CH_2CH_3$; $R^2 = CH_3$
Ia-3: $R^1 = CH_3$; $R^2 = C_2H_5$
Ia-4: $R^1 = CH_2CH_3$; $R^2 = C_2H_5$

General Synthesis Scheme:

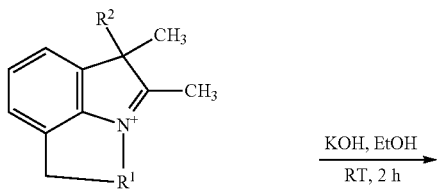

ED1-1a-1: $R^1 = CH_3$; $R^2 = CH_3$
ED1-1a-2: $R^1 = CH_2CH_3$; $R^2 = CH_3$
ED1-1a-3: $R^1 = CH_3$; $R^2 = C_2H_5$
ED1-1a-4: $R^1 = CH_2CH_3$; $R^2 = C_2H_5$

-continued

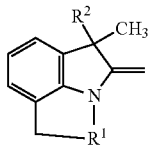

ED2-Ia-1: $R^1 = CH_2$; $R^2 = CH_3$
ED2-Ia-2: $R^1 = CH_2CH_2$; $R^2 = CH_3$
ED2-Ia-3: $R^1 = CH_2$; $R^2 = C_2H_5$
ED2-Ia-4: $R^1 = CH_2CH_2$; $R^2 = C_2H_5$ $HC(OEt)_3$, EtOH
reflux, 60 min

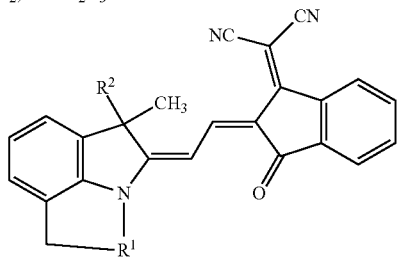

Ia-1: $R^1 = CH_2$; $R^2 = CH_3$ (yield: 19%)
Ia-2: $R^1 = CH_2CH_2$; $R^2 = CH_3$ (yield: 50%)
Ia-3: $R^1 = CH_2$; $R^2 = C_2H_5$ (yield: 31%)
Ia-4: $R^1 = CH_2CH_2$; $R^2 = C_2H_5$ (yield 54%)

General Method for Preparing Compounds ED2-Ia-1 to ED2-Ia-4:

1 equivalent of the corresponding salt ED1-Ia-1 to ED1-Ia-4 in 15-20 equivalents of dry ethanol (EtOH) was admixed with 1.1 equivalents of KOH. The solution was stirred at room temperature for 3 h, before the solvent was removed under reduced pressure. After adding the water, the mixture was extracted by shaking with diethyl ether. After removing the solvent again under reduced pressure, an oil was obtained, which was converted further directly.
Characterization:

1,1-Dimethyl-2-methylene-1,2,4,5-tetrahydropyrrolo[3,2,1-hi]indole (ED2-Ia-1)

Yield: 520 mg, 77%. $^1$H NMR (CDCl$_3$, 400 MHz): δ=6.93 (m, 1H), 6.87 (m, 1H), 6.63 (m, 1H), 3.95 (d, $^2$J=1.6 Hz, 1H), 3.87 (d, $^2$J=1.6 Hz, 1H), 3.65 (m, 2H), 3.41 (m, 2H), 1.42 (s, 6H). HRMS (ESI): calc. for C$_{13}$H$_{16}$N [M+H]$^+$: 186.1277, found: 186.1277.

1,1-Dimethyl-2-methylene-1,2,4,5-tetrahydropyrrolo[3,2,1-hi]quinoline (ED2-Ia-2)

Yield: 4.33 g, 42%. $^1$H NMR (CDCl$_3$, 400 MHz): δ=6.94 (m, 1H), 6.87 (m, 1H), 6.67 (m, 1H), 3.81 (d, $^2$J=1.6 Hz, 1H), 3.79 (d, $^2$J=1.6 Hz, 1H), 3.40 (t, $^3$J=5.8 Hz, 2H), 2.73 (m, 2H), 2.04 (m, 2H), 1.37 (s, 6H). HRMS (ESI): calc. for C$_{14}$H$_{18}$N [M+H]$^+$: 200.1434, found: 200.1434.

1-Ethyl-1-methyl-2-methylene-1,2,4,5-tetrahydropyrrolo[3,2,1-hi]indole (ED2-Ia-3)

Yield: 276 mg, 84%. $^1$H NMR (CDCl$_3$, 400 MHz, TMS): δ=6.91 (m, 1H), 6.83 (m, 1H), 6.62 (m, 1H), 3.91 (d, $^2$J=0.7 Hz, 1H), 3.88 (d, $^2$J=0.7 Hz, 1H), 3.54 (m, 2H), 2.96 (t, J=6.1 Hz, 2H), 1.78 (m, 2H), 1.36 (s, 3H), 0.76 (t, J=7.3 Hz, 3H). HRMS (ESI): calc. for C$_{14}$H$_{18}$N [M+H]$^+$: 200.1434, found: 200.1434.

1-Ethyl-1-methyl-2-methylene-1,2,4,5-tetrahydropyrrolo[3,2,1-hi]quinoline (ED2-Ia-4)

Yield: 590 mg, 97%. $^1$H NMR (CDCl$_3$, 400 MHz, TMS): δ=6.87 (m, 1H), 6.81 (m, 1H), 6.57 (m, 1H), 3.83 (d, $^2$J=0.7 Hz, 1H), 3.72 (d, $^2$J=0.7 Hz, 1H), 3.32 (m, 2H), 2.65 (t, J=6.1 Hz, 2H), 1.95 (m, 2H), 1.92 (m, 1H), 1.57 (m, 1H), 1.25 (s, 3H), 0.51 (t, J=7.3 Hz, 3H). HRMS (ESI): calc. for C$_{15}$H$_{20}$N [M+H]$^+$: 214.1590, found: 214.1590.

General Method for Preparing the Compounds Ia-1 to Ia-4:

1 equivalent of ED2-Ia-1 to ED2-Ia-4, 1 equivalent of 2-(3-oxoindan-1-ylidene)malononitrile and 1.5 equivalents of triethyl orthoformate in 1 ml/equivalent of ethanol were heated under reflux for 1 h. After removing the solvent, the product was purified by column chromatography (CH$_2$Cl$_2$) and reprecipitation from CH$_2$Cl$_2$/n-hexane.
Characterization:

2-{2-[2-(1,1-Dimethyl-4,5-dihydro-1H-pyrrolo[3,2,1-hi]indol-2-ylidene)ethylidene]-3-oxoindan-1-yliden}malononitrile (Ia-1)

Yield: 200 mg, 19%, brown solid. M.p. 277° C. $^1$H NMR (CDCl$_3$, 400 MHz): δ=8.55 (d, $^3$J=14.0 Hz, 1H), 8.34 (m, 1H), 7.58-7.73 (m, 4H), 7.39 (m, 1H), 7.31 (m, 1H), 7.22 (t, $^3$J=7.3 Hz, 1H), 4.64 (m, 2H), 3.77 (t, $^3$J=6.2 Hz, 2H), 1.65 (s, 6H). UV-vis (CH$_2$Cl$_2$): λ$_{max}$ (ε)=486 (20300), 586 (51100 M$^{-1}$ cm$^{-1}$). HRMS (ESI): calc. for C$_{26}$H$_{20}$N$_3$O [M+H]$^+$: 390.1600, found: 390.1599.

2-{2-[2-(1,1-Dimethyl-5,6-dihydro-1H,4H-pyrrolo[3,2,1-ij]quinolin-2-ylidene)ethylidene]-3-oxoindan-1-ylidene}malononitrile (Ia-2)

Yield: 1.4 g, 50%, brown solid. M.p. 291° C. $^1$H NMR (CDCl$_3$, 400 MHz): δ=9.00 (d, $^3$J=14.0 Hz, 1H), 8.56 (m, 1H), 7.92 (d, $^3$J=13.8 Hz, 1H), 7.70 (m, 1H), 7.58 (m, 2H), 7.15 (m, 3H), 4.05 (br, 2H), 2.90 (t, $^3$J=6.1 Hz, 2H), 2.25 (m, 2H), 1.79 (s, 6H). UV-vis (CH$_2$Cl$_2$): λ$_{max}$ (ε)=482 (21700), 578 (60300 M$^{-1}$ cm$^{-1}$). HRMS (ESI): calc. for C$_{27}$H$_{21}$N$_3$O [M]$^+$: 403.1685, found: 403.1679.

2-{2-[2-(1-Ethyl-1-methyl-4,5-dihydro-1H-pyrrolo[3,2,1-hi]indol-2-ylidene)ethylidene]-3-oxoindan-1-ylidene}malononitrile (Ia-3)

Yield: 170 mg, 31%, brown solid. M.p. 230° C. $^1$H NMR (DMSO-d$_6$, 400 MHz): δ8.56 (d, $^3$J=14.1 Hz, 1H), 8.34 (m, 1H), 7.65 (m, 4H), 7.34 (m, 2H), 7.23 (m, 1H), 4.67 (bs, 2H), 3.79 (m, 2H), 2.04 (m, 2H), 1.63 (s, 3H), 0.62 (t, $^3$J=7.4 Hz, 3H). UV-vis (CH$_2$Cl$_2$): λ$_{max}$ (ε)=486 (17500), 588 (45000). HRMS (ESI): calc. for C$_{27}$H$_{21}$N$_3$O [M]$^+$: 403.1685, found: 403.1679.

2-{2-[2-(1-Ethyl-1-methyl-5,6-dihydro-1H,4H-pyrrolo[3,2,11]quinolin-2-ylidene)ethylidene]-3-oxoindan-1-ylidene}malononitrile (Ia-4)

Yield: 200 mg, 54%, dark red solid. M.p. 255° C. $^1$H NMR (CDCl$_3$, 400 MHz): δ=8.96 (d, $^3$J=13.9 Hz, 1H), 8.54 (m, 1H), 7.90 (d, $^3$J=13.9 Hz, 1H), 7.70 (m, 1H), 7.57 (m, 2H), 7.14 (m, 3H), 4.05 (bs, 2H), 2.90 (t, $^3$J=6.2 Hz, 2H), 2.40 (bs, 1H), 2.22 (m, 3H), 1.78 (s, 3H), 0.53 (t, $^3$J=7.4 H, 3H). UV-vis (CH$_2$Cl$_2$): $\lambda_{max}$ ($\epsilon$)=481 (18900), 577 (50100 M$^{-1}$ cm$^{-1}$).
HRMS (ESI): calc. for C$_{28}$H$_{23}$N$_3$O [M]$^+$: 417.1814, found: 417.1834.
Compounds Ia-5 to Ia-12 Corresponding to the General Formula Ia:
Ia-5
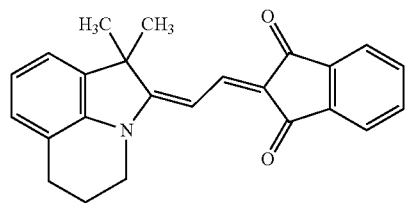
Ia-6
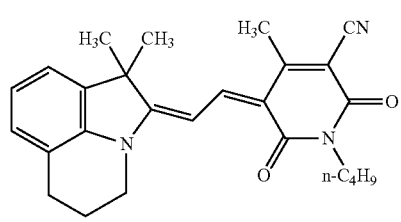
Ia-7
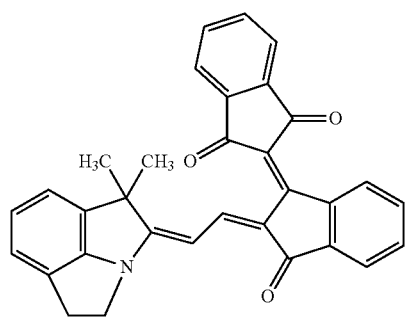
Ia-8
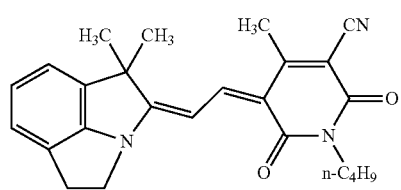
Ia-9
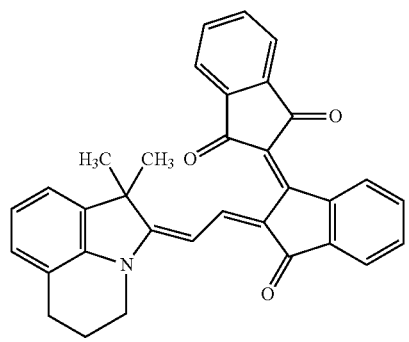
Ia-10
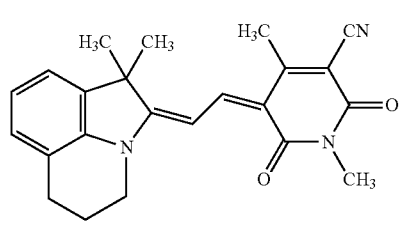
Ia-11
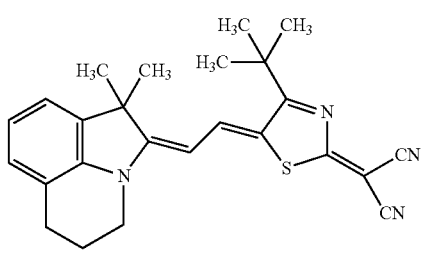
Ia-12
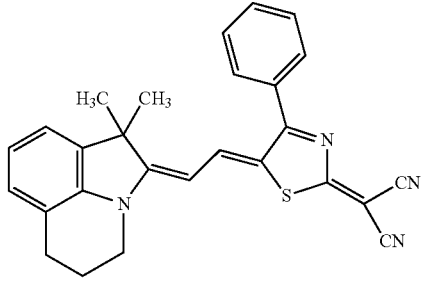
Synthesis:
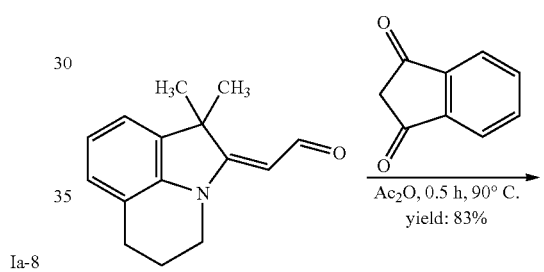
Ia-5
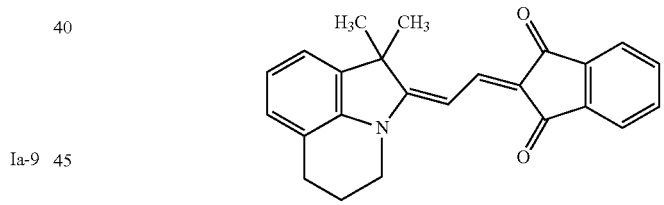
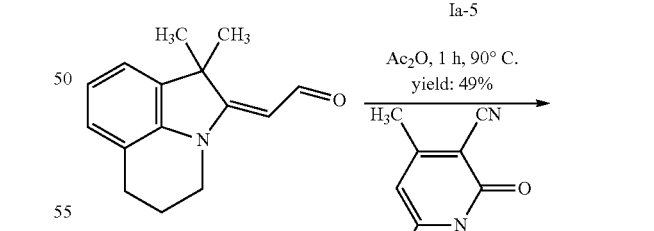
Ia-6
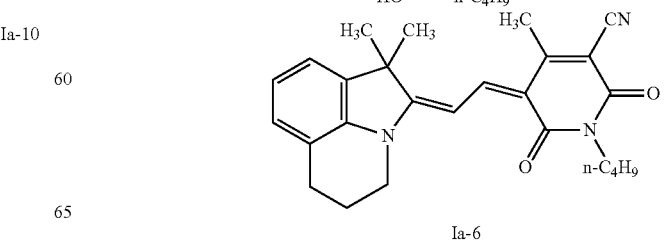

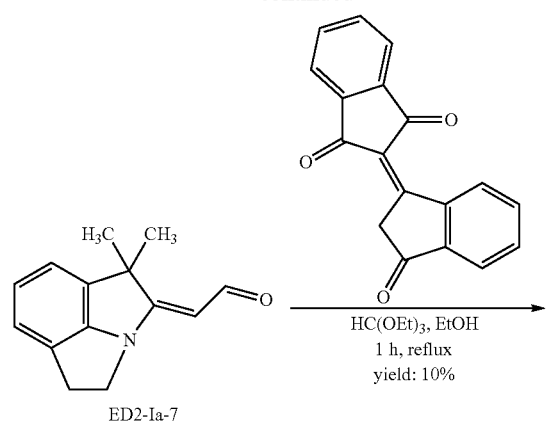
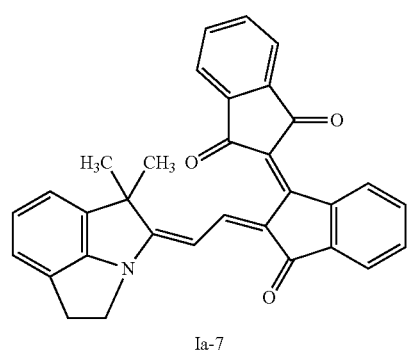
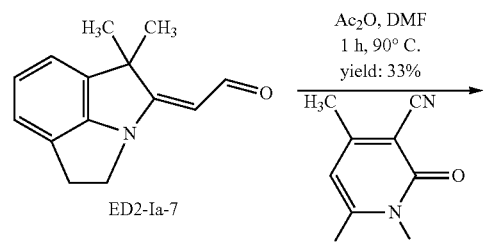
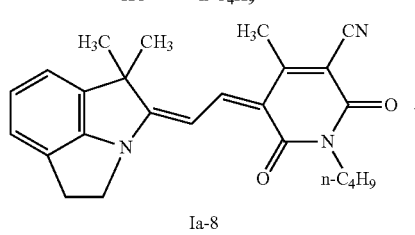
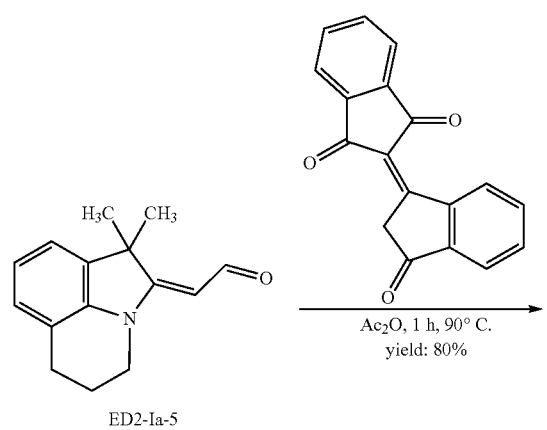
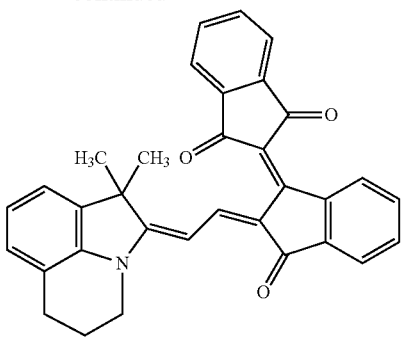
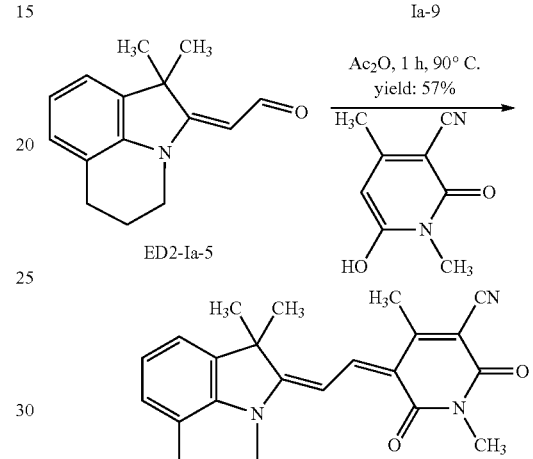
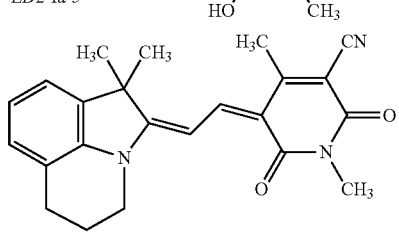
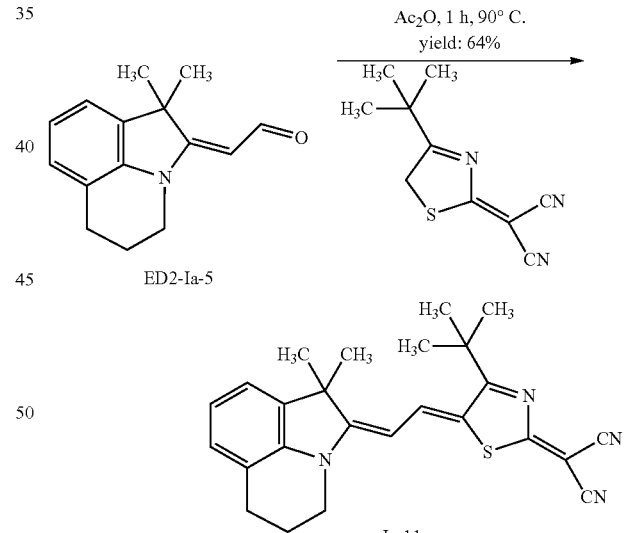
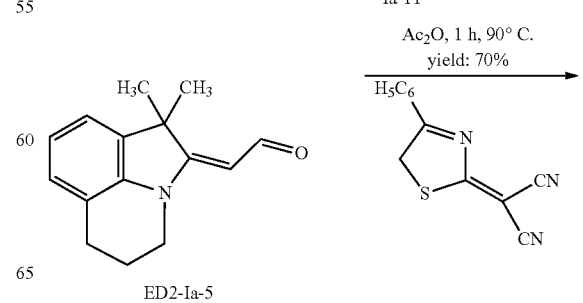

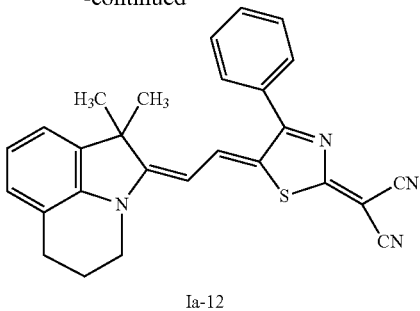

Ia-12

Preparation of 2-[2-(1,1-dimethyl-5,6-dihydro-1H,4H-pyrrolo[3,2,1-ij]quinolin-2-ylidene)ethylidene]indane-1,3-dione (Ia-5)

A solution of 1.5 ml of acetic anhydride (Ac$_2$O), compound ED2-Ia-5 (341 mg, 1.5 mmol) and indanedione (219 mg, 1.5 mmol) was heated to 90° C. for 30 min, before the solvent was removed under reduced pressure. After column chromatography (CH$_2$Cl$_2$), the resulting solid was dissolved in CH$_2$Cl$_2$ and precipitated with n-hexane.

Yield: 440 mg (1.24 mmol, 83%), violet solid. M.p. 245-248° C. $^1$H NMR (CDCl$_3$, 400 MHz): δ 8.08 (d, $^3$J=14.2 Hz, 1H), 7.77 (m, 2H), 7.60 (m, 2H), 7.37 (d, $^3$J=14.2 Hz, 1H), 7.15 (m, 1H), 7.06 (m, 2H), 3.93 (bm, 2H), 2.86 (t, $^3$J=6.1 Hz, 2H), 2.21 (m, 2H), 1.74 (s, 6H). UV/Vis (CH$_2$Cl$_2$): λ$_{max}$ (ε): 500 (111200 M$^{-1}$ cm$^{-1}$). HRMS (ESI): calc. for C$_{24}$H$_{21}$NO$_2$ [M]$^+$: 355.1572, found: 355,1567. Anal. calc. for C$_{24}$H$_{21}$NO$_2$: C, 81.10; H, 5.96; N, 3.94. Found: C, 80.75; H, 5.96; N, 4.10.

Preparation of 1-butyl-5-[2-(1,1-dimethyl-5,6-dihydro-1H,4H-pyrrolo[3,2,11]quinolin-2-ylidene)ethylidene]-4-methyl-2,6-dioxo-1,2,5,6-tetrahydropyridine-3-carbonitrile (Ia-6)

A solution of 1.5 ml of Ac$_2$O, compound ED2-Ia-5 (341 mg, 1.5 mmol) and the pyridine derivative (309 mg, 1.5 mmol) was heated to 90° C. for 30 min, before the solvent was removed under reduced pressure. The residue was dissolved in CH$_2$Cl$_2$ and precipitated with n-hexane, before column chromatography (CH$_2$Cl$_2$) was performed. The resulting solid was dissolved again in CH$_2$Cl$_2$ and precipitated with n-hexane.

Yield: 304 mg (0.73 mmol, 49%), red solid. M.p. 247-249° C. $^1$H NMR (CDCl$_3$, 400 MHz): δ 8.00 (d, $^3$J=14.0 Hz, 1H), 7.87 (d, $^3$J=14.0 Hz, 1H), 7.21 (m, 1H), 7.16 (m, 2H), 4.03 (t, $^3$J=5.9 Hz, 2H), 3.99 (t, $^3$J=7.6 Hz, 2H), 2.90 (t, $^3$J=6.1 Hz, 2H), 2.51 (s, 3H), 2.23 (m, 2H), 1.72 (s, 6H), 1.63 (m, 2H), 1.39 (m, 2H), 0.94 (t, $^3$J=7.4 Hz, 3H). UV/Vis (CH$_2$Cl$_2$): λ$_{max}$ (ε): 529 (133500 M$^{-1}$ cm$^{-1}$). HRMS (ESI): calc. for C$_{26}$H$_{30}$N$_3$O$_2$ [M+H]$^+$: 416.2333, found: 416.2335.

Preparation of 2-[2-(1,1-dimethyl-5,6-dihydro-1H,4H-pyrrolo[3,2,1-ij]quinolin-2-ylidene)ethylidene]-[1,2']biindenylidene-3,1',3'-trione (Ia-7)

A solution of 7.0 ml of EtOH, compound ED2-Ia-7 (370 mg, 2.0 mmol), the indanedione derivative (548 mg, 2.0 mmol) and triethyl orthoformate (430 mg, 2.9 mmol) was heated under reflux for 1 h, before the solvent was removed under reduced pressure. After column chromatography (CH$_2$Cl$_2$), the resulting solid was dissolved in CH$_2$Cl$_2$ and precipitated with n-hexane.

Yield: 97 mg (0.21 mmol, 10%), dark green solid. M.p. 269-272° C. $^1$H NMR (CDCl$_3$, 400 MHz): δ 8.43 (m, 1H), 8.13 (bm, 1H), 7.84 (m, 2H), 7.65 (m, 4H), 7.48 (m, 2H), 7.17 (m, 3H), 4.46 (t, $^3$J=6.9 Hz, 2H). 3.80 (t, $^3$J=6.9 Hz, 2H), 1.65 (s, 6H). UV/Vis (CH$_2$Cl$_2$): λ$_{max}$ (ε): 669 (35400 M$^{-1}$ cm$^{-1}$). HRMS (ESI): calc. for C$_{32}$H$_{24}$NO$_3$ [M+H]$^+$: 470.1751, found: 470.1751.

Preparation of 1-butyl-5-[2-(1,1-dimethyl-4,5-dihydro-1H-pyrrolo[3,2,1-hi]indol-2-ylidene)ethylidene]-4-methyl-2,6-dioxo-1,2,5,6-tetrahydropyridine-3-carbonitrile (Ia-8)

A solution of 5.0 ml of Ac$_2$O, compound ED2-Ia-7 (926 mg, 5 mmol), the pyridine derivative (1.03 g, 5 mmol) and dimethylformamide (DMF; 550 mg, 7.5 ml) was heated to 90° C. for 1 h, before the solvent was removed under reduced pressure. The residue was dissolved in CH$_2$Cl$_2$ and precipitated with n-hexane, before column chromatography (CH$_2$Cl$_2$: MeOH=98:2) was performed. The resulting solid was dissolved again in CH$_2$Cl$_2$ and precipitated with n-hexane.

Yield: 666 mg (1.66 mmol, 33%), dark red solid. M.p. 246-249° C. $^1$H NMR (DMSO-d$_6$, 400 MHz): δ 7.78 (d, $^3$J=14.5 Hz, 1H), 7.57 (d, $^3$J=14.5 Hz, 1H), 7.39 (d, $^3$J=7.3 Hz, 1H), 7.31 (d, $^3$J=6.9 Hz, 1H), 7.21 (t, $^3$J=7.3 Hz, 1H), 4.73 (m, 2H), 3.84 (t, $^3$J=7.4 Hz, 2H), 3.77 (t, $^3$J=6.8 Hz, 2H), 2.47 (s, 3H), 1.58 (s, 6H), 1.47 (m, 2H), 1.27 (m, 2H), 0.90 (t, $^3$J=7.4 Hz, 3H). UV/Vis (CH$_2$Cl$_2$): λ$_{max}$(ε): 537 (117400 M$^{-1}$ cm$^{-1}$). HRMS (ESI): calc. for C$_{25}$H$_{28}$N$_3$O$_2$ [M+H]$^+$: 402.2176, found: 402.2176. Anal. calc. for C$_{25}$H$_{27}$N$_3$O$_2$: C, 74.79; H, 6.78; N, 10.47. Found: C, 74.36; H, 6.73; N, 10.58.

General Method for Preparing the Compounds Ia-9 to Ia-12:

1 equivalent of the acceptable molecule and 1 equivalent of the donor molecule ED2-Ia-5 in 1 ml/equivalent of Ac$_2$O were heated to 90° C. for 1 h. Once the solvent had been removed, the precipitated solid was washed with n-hexane and isopropanol, and purified if necessary by means of column chromatography, and the product was reprecipitated from a CH$_2$Cl$_2$/n-hexane mixture.

Characterization:

2-[2-(1,1-Dimethyl-5,6-dihydro-1H,4H-pyrrolo[3,2,1-ij]quinolin-2-ylidene)ethylidene]-[1,2']biindenylidene-3,1',3'-trione (Ia-9)

Yield: 339 mg (0.70 mmol, 80%), brown solid. $^1$H NMR (CD$_2$Cl$_2$, 400 MHz): δ 8.51 (d, $^3$J=14.6 Hz, 1H), 8.42 (m, 1H), 7.85 (m, 3H), 7.67 (m, 2H), 7.59 (m, 2H), 7.43 (m, 2H), 7.22 (m, 1H), 7.17 (m, 1H), 4.12 (m, 2H), 2.91 (m, 2H), 2.26 (m, 2H), 1.70 (s, 6H). UV-vis (CH$_2$Cl$_2$): λ$_{max}$ (ε): 665 (46500 M$^{-1}$ cm$^{-1}$). HRMS (ESI): calc. for C$_{33}$H$_{26}$NO$_3$ [M+H]$^+$: 484.1907, found 484.1908.

5-[2-(1,1-Dimethyl-5,6-dihydro-1H,4H-pyrrolo[3,2,1-ij]quinolin-2-ylidene)ethylidene]-1,4-dimethyl-2,6-dioxo-1,2,5,6-tetrahydropyridine-3-carbonitrile (Ia-10)

Yield: 186 mg (0.50 mmol, 57%), red solid. $^1$H NMR (CD$_2$Cl$_2$, 400 MHz): δ 8.03 (m, 1H), 7.91 (m, 1H), 7.23 (m, 1H), 7.16 (m, 2H), 4.03 (2H), 3.29 (s, 3H), 2.90 (m, 2H), 2.52 (s, 3H), 2.22 (m, 2H), 1.71 (s, 6H). UV-vis (CH$_2$Cl$_2$): λ$_{max}$ (ε):

529 (131600 M$^{-1}$ cm$^{-1}$). HRMS (ESI): calc. for C$_{23}$H$_{24}$N$_3$O$_2$ [M+H]$^+$: 374.1863, found 374.1861.

2-{4-tert-Butyl-5-[2-(1,1-dimethyl-5,6-dihydro-1H,4H-pyrrolo[3,2,1-ij]quinolin-2-ylidene)ethylidene]-5H-thiazol-2-ylidene}malononitrile (Ia-11)

Eluent for column chromatography: DCM with 0.2% MeOH.

Yield: 235 mg (0.57 mmol, 64%), dark blue solid. $^1$H NMR (CD$_2$Cl$_2$, 400 MHz): δ 8.29 (d, $^3$J=13.5 Hz, 1H), 7.20 (m, 1H), 7.14 (m, 2H), 5.60 (d, $^3$J=13.6 Hz, 1H), 3.90 (m, 2H), 2.88 (m, 2H), 2.22 (m, 2H), 1.68 (s, 6H), 1.54 (s, 9H). UV-vis (CH$_2$Cl$_2$): λ$_{max}$ (ε): 627 (146100 M$^{-1}$ cm$^{-1}$). HRMS (ESI): calc. for C$_{25}$H$_{26}$N$_4$S [M]$^+$: 414.1878, found 414.1873.

2-{5-[2-(1,1-Dimethyl-5,6-dihydro-1H,4H-pyrrolo[3,2,1-ij]quinolin-2-ylidene)ethylidene]-4-phenyl-5H-thiazol-2-ylidene}malononitrile (Ia-12)

Eluent for column chromatography: DCM with 0.3% MeOH.

Yield: 267 mg (0.61 mmol, 70%), green-blue solid. $^1$H NMR (CD$_2$Cl$_2$, 400 MHz): δ 7.99 (d, $^3$J=13.7 Hz, 1H), 7.73 (m, 2H), 7.59 (m, 3H), 7.17 (m, 3H), 5.83 (d, $^3$J=13.1 Hz, 1H), 3.96 (m, 2H), 2.89 (m, 2H), 2.23 (m, 2H), 1.55 (s, 6H). UV-vis (CH$_2$Cl$_2$): λ$_{max}$ (ε): 635 (123200 M$^{-1}$ cm$^{-1}$). HRMS (ESI): calc. for C$_{27}$H$_{22}$N$_4$S [M]$^+$: 434.1565, found 434.1559.

Compounds Ie-1 and Ie-2 Corresponding to the General Formula Ie

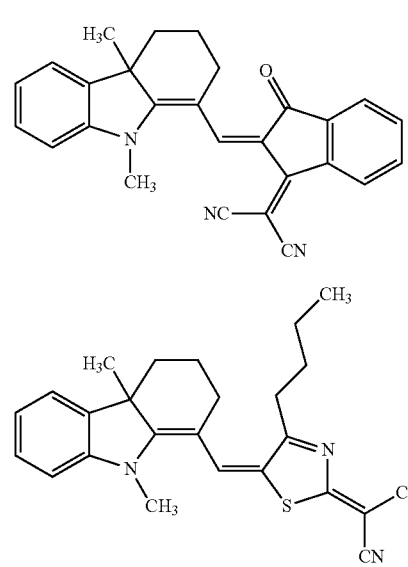

The precursor ED1-Ie-1 was prepared based on H. Fritz, Chemische Berichte 92, 1959, p. 1809-1817. The compounds Ie-1 and Ie-2 were synthesized by condensing the compound ED1-Ie-1 with compound ED2-Ie-1 (compound Ie-1), or ED1-Ie-1 with compound ED2-Ie-2 (compound Ie-2).

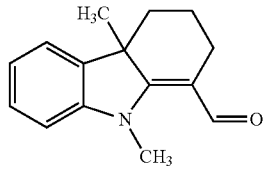

ED1-Ie-1

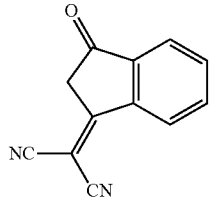

ED2-Ie-1

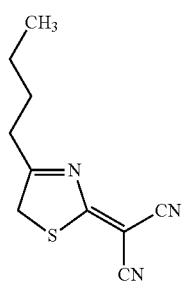

ED2-Ie-2

Preparation of Compound Ie-1:

1.1 g of the compound ED1-Ie-1 and 1.0 g of the compound ED2-Ie-1 were stirred in 15 ml of acetic anhydride at 50-55° C. for 3 hours. After cooling to room temperature, the precipitated dye was filtered off with suction and washed with 10 ml of methanol and then 100 ml of water. After drying under reduced pressure at 60° C., the dye was dissolved in methylene chloride and precipitated with n-hexane. Filtration with suction was followed by repeated washing with n-hexane, and drying of the residue at 60° C. under reduced pressure. Yield: 1.02 g (50.6%), UV/VIS: 572 nm (25200)

Preparation of Compound Ie-2:

1.1 g of the compound ED1-Ie-1 and 1.0 g of the compound ED2-Ie-2 were converted and purified as described above. Yield: 0.87 g (42%), UV/VIS: 626 nm (113000)

II. Examples of Solar Cells:

All solar cells detailed were produced according to the following steps:

Sublimation of the Merocyanines:

The materials listed at the outset were purified by zone sublimation, the pressure during the entire sublimation having been kept below 1×10$^{-5}$ mbar. The yields of the purification by sublimation for each material are listed in table 2.

Materials:

The merocyanines (also referred to hereinafter as Mcy) were used either as obtained from the synthesis or in the purified state, as described above.

NPD: from Alfa Aesar; sublimed once

C60: from Alfa Aesar; sublimed purity (+99.92%); used without further purification Bphen: from Alfa Aesar; used without further purification Preparation of the Substrate:

The ITO was applied to the glass substrate by sputtering in a thickness of 140 nm. The specific resistivity was 200 μΩcm and roughness mean square (RMS) was <5 nm. The substrate was treated with ozone under UV light for 20 minutes before the deposition of the further layers.

Production of the Cells:

Cells of constructions A) and B) were prepared under high vacuum (pressure<$10^{-6}$ mbar).

The cell of construction A) (ITO/merocyanine/C60/Bphen/Ag) was produced by successive deposition of the merocyanine and C60 onto the ITO substrate. The deposition rate was 0.1 nm/second for both layers. The evaporation temperatures of the merocyanines are listed in table 1. C60 was deposited at 400° C. Once the Bphen layer had been applied, a 100 nm-thick Ag layer was applied by vapor deposition as the top electrode. The cell had an area of 0.031 $cm^2$.

For the production of the cells of construction B), (ITO/(merocyanine:C60-1:1 by weight)/C60/Bphen/Ag), the merocyanine and the C60 were coevaporated and applied to the ITO with the same deposition rate of 0.1 nm/second, such that a mass ratio of 1:1 was present in the mixed active layer. The Bphen and Ag layers were identical to the corresponding layers of construction A).

The data of a cell with a BHJ layer on a doped HTL (layer 22) are listed in table 3. NPD and $F_4$-TCNQ were applied by vapor deposition as the HTL and dopant in a mass ratio of 20:1. The HTL layer improved the open-circuit voltage $V_{oc}$ (oc: open circuit) and provided higher efficiencies.

Analyses:

An AM 1.5 simulator from Solar Light Co. Inc. with a xenon lamp (model 16S-150 V3) was used. The UV range below 415 nm was filtered out and the current-voltage measurements were carried out under ambient conditions. The intensity of the solar simulator was calibrated with a monocrystalline FZ solar cell (Fraunhofer ISE) and the deviation factor was determined to be virtually 1.0.

Results of the Solar Cells:

TABLE 1

Results with merocyanines detailed at the outset in construction A). The evaporation temperatures $T_V$ are likewise listed.

| Mcy (ID) | $T_V$(° C.) | Mcy thickness (nm) | C60 thickness (nm) | Voc (mV) | Jsc (mA/$cm^2$) | FF (%) | Efficiency (%) |
|---|---|---|---|---|---|---|---|
| 606 | 180 | 10 | 40 | 460 | 7.3 | 62 | 2.0 |
| 716 | 175 | 10 | 40 | 420 | 7.0 | 67 | 1.9 |

TABLE 2

Results with merocyanines detailed at the outset in construction B). The evaporation temperatures $T_V$ are likewise listed.

| ID | BHJ thickness (nm) | C60 thickness (nm) | Voc (mV) | Jsc (mA/$cm^2$) | FF (%) | Efficiency (%) |
|---|---|---|---|---|---|---|
| 606 | 30 | 20 | 580 | 10.8 | 46 | 2.8 |
| 716 | 30 | 20 | 520 | 11.5 | 45 | 2.6 |

The invention claimed is:

1. A process for producing a photoactive layer, comprising producing a photoactive layer with a mixture comprising a component K1 and a component K2, wherein:

K1 is of any of general formulae:

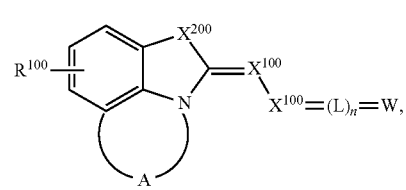
(Ia)

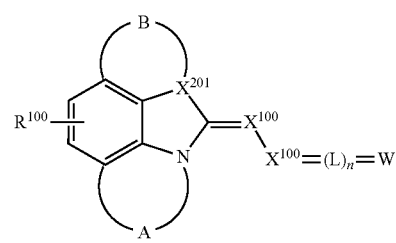
(Ic)

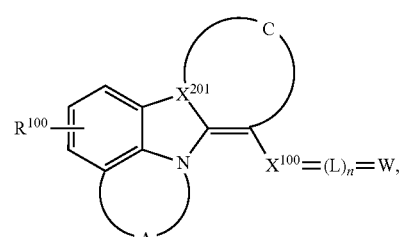
(Id)

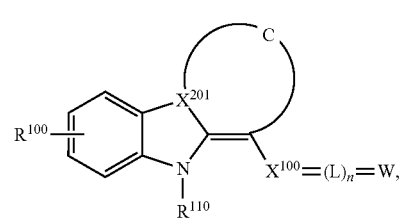
(Ie)

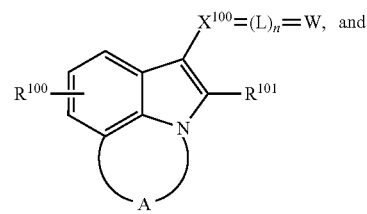
(IIa)

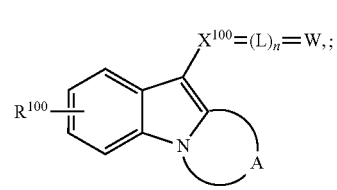
(IIb)

K1 is an electron donor or electron acceptor;

each A is independently a bridge consisting of two or three $sp^3$-hybridized carbon atoms, in which each carbon atom is optionally substituted by one $R^{101}$ substituent each, and in which each carbon atom is optionally benzofused;

each B and C is independently a bridge consisting of two or three carbon atoms, each of which is sp²- or sp³-hybridized, and each of which is optionally substituted by one $R^{101}$ substituent;

each W is independently O, S, N—CN, N—$R^{110}$, C(CN)₂, C(CO₂$R^{110}$)₂, C(CN)COR$^{110}$, C(CN)CO₂$R^{110}$, or C(CN)CONR$^{110}$;

each L is independently a divalent carbocycle or heterocycle, which is optionally singly or multiply fused;

each n is independently 0 or 1;

each $X^{100}$ is independently CH, N, or C(CN);

each $X^{200}$ is independently C($R^{111}$)₂, O, S, SO₂, or NR$^{110}$;

each $X^{201}$ is independently CR$^{111}$ or an sp²-hybridized unsubstituted carbon atom bonded to an sp²-hybridized carbon atom of B or C;

each $R^{100}$ is independently H, alkyl, $C_1$-$C_6$-alkylene-COO-alkyl, $C_1$-$C_6$-alkylene-O—CO-alkyl, $C_1$-$C_6$- alkylene-O—CO—O-alkyl, cycloalkyl, arylalkyl, aryl, OR$^{110}$, SR$^{110}$, hetaryl, halogen, NO₂, or CN;

each $R^{101}$ is independently alkyl, $C_1$-$C_6$-alkylene-COO-alkyl, $C_1$-$C_6$-alkylene-O—CO—alkyl, $C_1$-$C_6$-alkylene-O—CO—O-alkyl, cycloalkyl, arylalkyl, aryl, or hetaryl;

each $R^{110}$ is independently H, alkyl, $C_1$-$C_6$-alkylene-COO-alkyl, $C_1$-$C_6$-alkylene-O—CO-alkyl, $C_1$-$C_6$- alkylene-O—CO—O-alkyl, cycloalkyl, arylalkyl, or aryl;

each $R^{111}$ is independently H, alkyl, $C_1$-$C_6$-alkylene-COO-alkyl, $C_1$-$C_6$-alkylene-O—CO-alkyl, $C_1$-$C_6$- alkylene-O—CO—O-alkyl, cycloalkyl, arylalkyl, aryl, or hetaryl;

each carbon chain of an alkyl or cycloalkyl radical in K1 independently is optionally interrupted by one or two nonadjacent oxygen atoms; and component K2 is a compound capable of acting as an electron acceptor or electron donor correspondingly with respect to component K1.

2. The process of claim 1, wherein:

when n is 1, L is a moiety selected from the group consisting of:

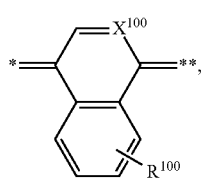
(L-01)

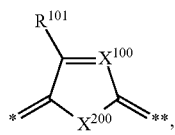
(L-02)

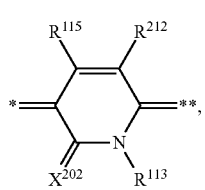
(L-03)

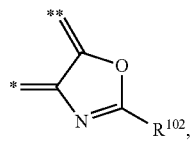
(L-04)

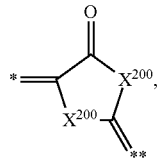
(L-05)

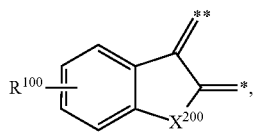
(L-06)

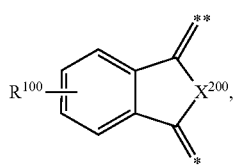
(L-07)

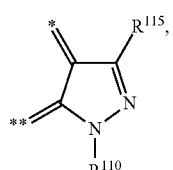
(L-08)

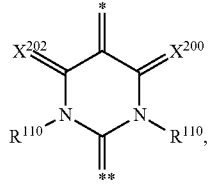
(L-09)

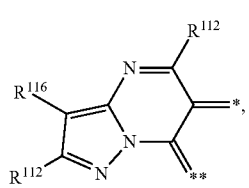
(L-10)

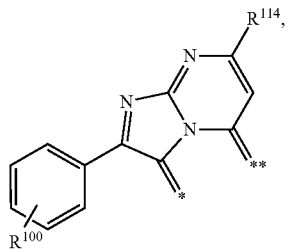
(L-11)

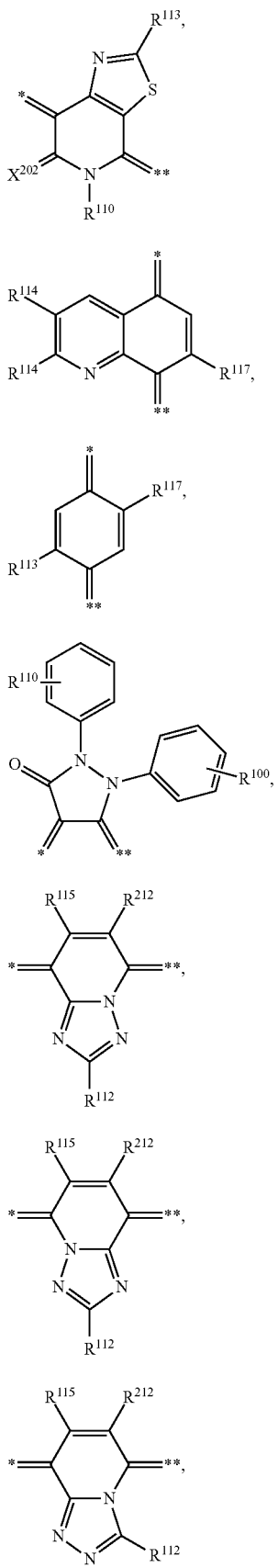
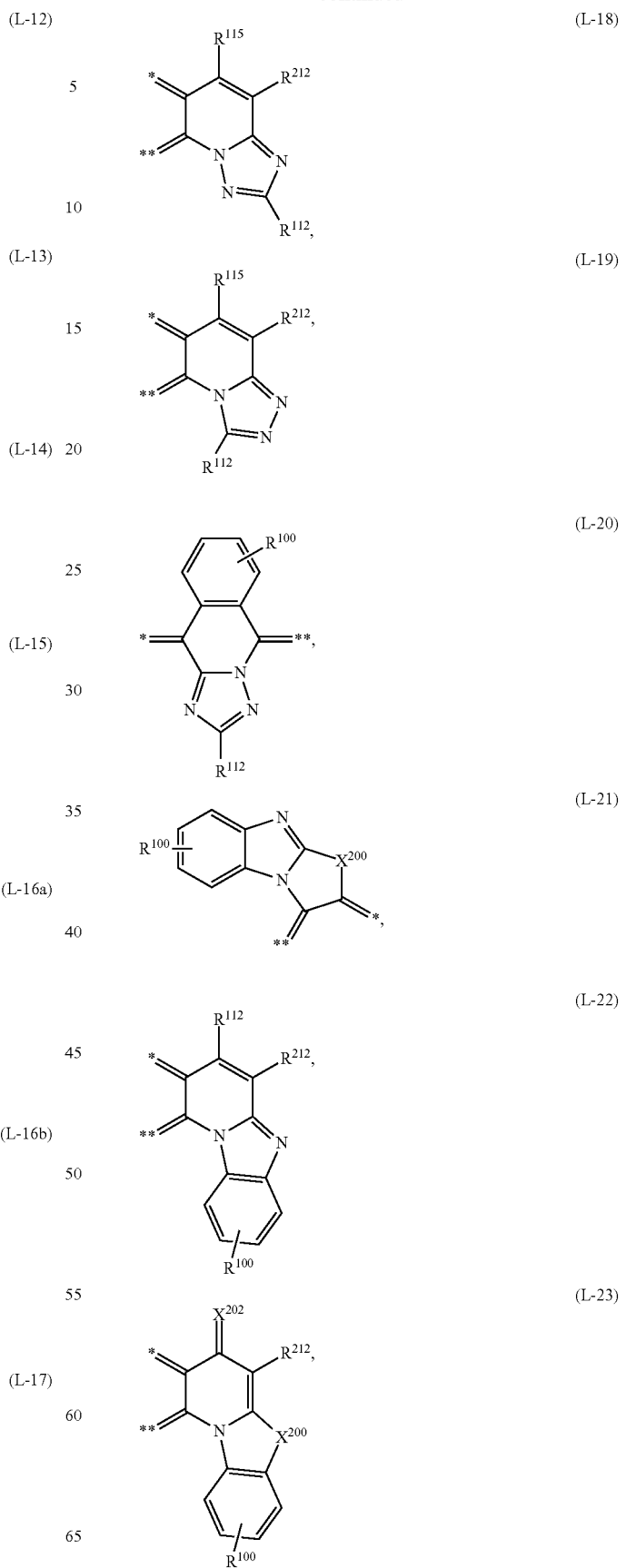

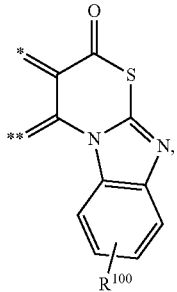
(L-24)

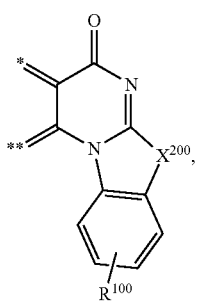
(L-25)

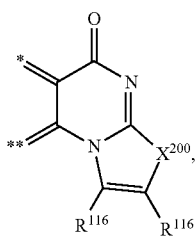
(L-26)

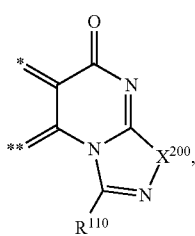
(L-27)

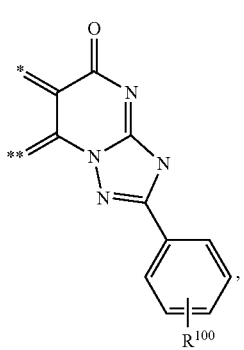
(L-28)

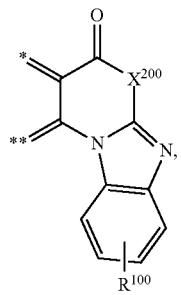
(L-29)

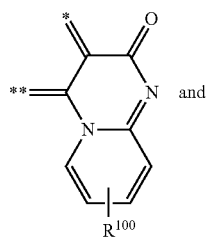
(L-30)

and

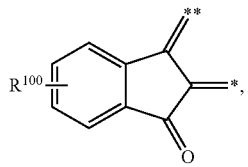
(L-31)

each $R^{102}$ is independently arylalkyl, aryl, or hetaryl;

each $R^{112}$ is independently H, alkyl, $C_1$-$C_6$-alkylene-COO-alkyl, $C_1$-$C_6$-alkylene-O—CO-alkyl, $C_1$-$C_6$- alkylene-O—CO—O-alkyl, cycloalkyl, arylalkyl, aryl, $OR^{110}$, or $SR^{110}$;

each $R^{113}$ is independently H, alkyl, $C_1$-$C_6$-alkylene-COO-alkyl, $C_1$-$C_6$-alkylene-O—CO-alkyl, $C_1$-$C_6$- alkylene-O—CO—O-alkyl, cycloalkyl, arylalkyl, aryl, hetaryl, NH-aryl, N(aryl)$_2$, NHCO-$R^{101}$, or N(CO—$R^{101}$)$_2$;

each $R^{114}$ is independently H, alkyl, partly fluorinated alkyl, partly perfluorinated alkyl, $C_1$-$C_6$-alkylene-COO-alkyl, $C_1$-$C_6$-alkylene-O—CO-alkyl, or $C_1$-$C_6$-alkylene-O—CO—O-alkyl;

each $R^{115}$ is independently H, alkyl, partly fluorinated alkyl, partly perfluorinated alkyl, $C_1$-$C_6$-alkylene-COO-alkyl, $C_1$-$C_6$-alkylene-O—CO-alkyl, $C_1$-$C_6$- alkylene-O—CO—O-alkyl, cycloalkyl, arylalkyl, aryl, NHCO-$R^{101}$, or N(CO-$R^{101}$)$_2$;

each $R^{116}$ is independently H, alkyl, $C_1$-$C_6$-alkylene-COO-alkyl, $C_1$-$C_6$-alkylene-O—CO-alkyl, $C_1$-$C_6$- alkylene-O—CO—O-alkyl, cycloalkyl, arylalkyl, aryl, $CO_2R^{110}$, or CN;

each $R^{117}$ is independently H, alkyl, $C_1$-$C_6$-alkylene-COO-alkyl, $C_1$-$C_6$-alkylene-O—CO-alkyl, $C_1$-$C_6$- alkylene-O—CO—O-alkyl, cycloalkyl, arylalkyl, aryl, $OR^{110}$, $SR^{110}$halogen, or hetary;

each $R^{212}$ is independently H, CN, $CONR^{110}$, or $COR^{101}$;

each $X^{202}$ is independently O, S, or two hydrogen atoms;

* and ** denote attachment to $X^{100}$ or W; and each carbon chain of an alkyl or cycloalkyl radical in L independently is optionally interrupted by one or two nonadjacent oxygen atom.

3. The process of claim 1, wherein component K2 comprises at least one compound selected from the group consisting of a fullerene, a polycyclic aromatic hydrocarbon, a quinone, a quinodimethane, a quinonediimine, a phthalocyanine, a subphthalocyanine, a porphyrin, a tetraazaporphyrin, a tetrabenzoporphyrin, athiophene, an oligothiophene, a fused thiophene, a thiadiazole, a carbazole, a triarylamine, an indanthrone, a violanthrone, a flavanthones, a fulvalene, a tetrathiafulvalene, a tetraselenafulvalene, a diketopyrrolopyrrole, and a derivative thereof.

4. The process of claim 1, wherein component K2 comprises a fullerene, a fullerene derivative, or a combination thereof.

5. The process of claim 4, wherein component K2 comprises a fullerene.

6. The process of claim 5, wherein component K2 comprises a C60-fullerene of formula k2:

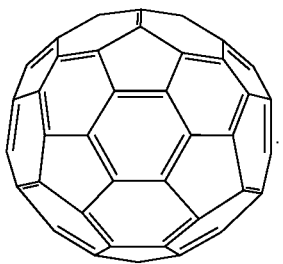

(k2)

7. The process of claim 1, wherein:

the component K1 is present in the mixture in a proportion of from 10 to 90% by mass;u the component K2 is present in the mixture in a proportion of from 90 to 10% by mass; and the proportions of the components K1 and K2, are based in each case on a total mass of components K1 and K2, add up to 100% by mass.

8. The process of claim 3, wherein producing the photoactive layer with the mixture comprises depositing the components K1 and K2 on a substrate successively, simultaneously, or in alternating sequence by vacuum sublimation.

9. The process of claim 8, wherein after depositing the components K1 and K2 the component K1 is present on the substrate in a proportion of from 10 to 90% by mass, and the component K2 is present on the substrate in a proportion of from 90 to 10% by mass, based in each case on a total mass of components K1 and K2.

10. An organic solar cell or organic photodetector, comprising a photoactive layer obtained by a process comprising the process of claim 1.

11. A mixtur; comprising a component K1 and a component K2, wherein:

the component K1 is of any of general formulae:

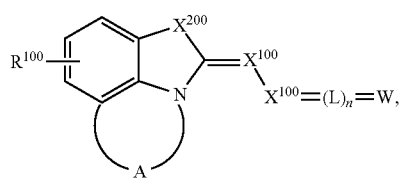

(Ia)

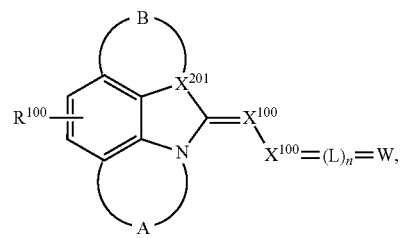

(Ic)

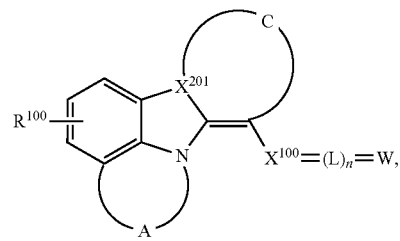

(Id)

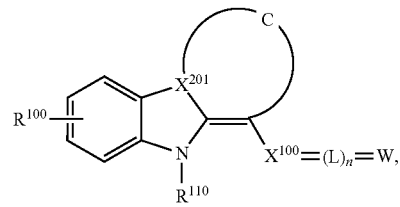

(Ie)

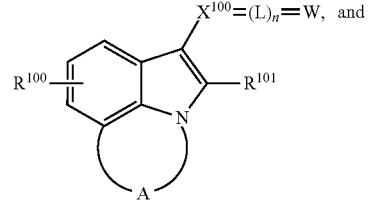

(IIa)

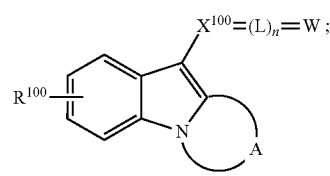

(IIb)

the component K1 is an electron donor or electron acceptor;

each A is independently a bridge consisting of two or three $sp^3$-hybridized carbon atoms, in which each carbon atom is optionally substituted by one $R^{101}$ substituent each, and in which each carbon atom is optionally benzofused;

each B and C is independently a bridge consisting of two or three carbon atoms, each of which is $sp^2$- or $sp^3$-hybridized, and each of which is optionally substituted by one $R^{101}$ substituent;

each W is independently O, S, N—CN, N—$R^{110}$, $C(CN)_2$, $C(CO_2R^{110})_2$, $C(CN)COR^{110}$, $C(CN)CO_2R^{110}$, or $C(CN)CONR^{110}$;

each L is independently a divalent carbocycle or heterocycle, which is optionally singly or multiply fused;

each n is independently 0 or 1;

each $X^{100}$ is independently CH, N, or C(CN);

each $X^{200}$ is independently $C(R^{111})_2$, O, S, $SO_2$, or $NR^{110}$;

each $X^{201}$ is independently $CR^{111}$ or an $sp^2$-hybridized unsubstituted carbon atom bonded to an $sp^2$-hybridized carbon atom of B or C;

each $R^{100}$ is independently H, alkyl, $C_1$-$C_6$-alkylene-COO-alkyl, $C_1$-$C_6$-alkylene-O—CO-alkyl, $C_1$-$C_6$-alkylene-O—CO—O-alkyl, cycloalkyl, arylalkyl, aryl, OR110, $SR^{110}$, hetaryl, halogen, $NO_2$, or CN;

each $R^{101}$ is independently alkyl, $C_1$-$C_6$-alkylene-COO-alkyl, $C_1$-$C_6$-alkylene-O—CO—alkyl, $C_1$-$C_6$-alkylene-O—CO—O-alkyl, cycloalkyl, arylalkyl, aryl, or hetaryl;

each $R^{110}$ is independently H, alkyl, $C_1$-$C_6$-alkylene-COO-alkyl, $C_1$-$C_6$-alkylene-O—CO-alkyl, $C_1$-$C_6$-alkylene-O—CO—O-alkyl, cycloalkyl, arylalkyl, or aryl;

each $R^{111}$ is independently H, alkyl, $C_1$-$C_6$-alkylene-COO-alkyl, $C_1$-$C_6$-alkylene-O—CO-alkyl, $C_1$-$C_6$-alkylene-O—CO—O-alkyl, cycloalkyl, arylalkyl, aryl, or hetaryl;

each carbon chain of an alkyl or cycloalkyl radical in the component K1 independently is optionally interrupted by one or two nonadjacent oxygen atoms;

the component K2 comprises at least one compound selected from the group consisting of a fullerene, a polycyclic aromatic hydrocarbon, a quinone, a quinodimethane, a quinonediimine, a phthalocyanine, a subphthalocyanine, a porphyrin, a tetraazaporphyrin, a tetrabenzoporphyrin, athiophene, an oligothiophene, a fused thiophene, a thiadiazole, a carbazole, a triarylamine, an indanthrone, a violanthrone, a flavanthones, a fulvalene, a tetrathiafulvalene, a tetraselenafulvalene, a diketopyrrolopyrrole, and a derivative thereof; and the component K2 is a compound capable of acting as an electron acceptor or electron donor correspondingly with respect to the component K1.

12. The mixture of claim 11, wherein:
the component K1 is present in a proportion of from 10 to 90% by mass;
the component K2 is present in a proportion of from 90 to 10% by mass; and
the proportions of the components K1 and K2, based in each case on a total mass of the components K1 and K2, add up to 100% by mass.

13. The process of claim 3, wherein the component K2 comprises at least one polycyclic aromatic hydrocarbon selected from the group consisting of naphthalene, rylene, acene, pyrene, coronene, hexabenzocoronene, and a derivative thereof.

14. The process of claim 13, wherein the component K2 comprises at least one polycyclic aromatic hydrocarbon selected from the group consisting of perylene, terrylene, quaterrylene, anthracene, tetracene, pentacene, and a derivative thereof.

15. The process of claim 14, wherein the component K2 comprises rubrene.

16. The process of claim 3, wherein the component K2 comprises thienothiophene, bithienothiophene, or a combination thereof.

17. The process of claim 7, wherein:
the component K1 is present in the mixture in a proportion of from 20 to 80% by mass; and
the component K2 is present in the mixture in a proportion of from 80 to 20% by mass.

18. The process of claim 9, wherein after depositing the components K1 and K2, the component K1 is present on the substrate in a proportion of from 20 to 80% by mass, and the component K2 is present on the substrate in a proportion of from 80 to 20% by mass.

19. The mixture of claim 12, wherein:
the component K1 is present in a proportion of from 20 to 80% by mass; and
the component K2 is present in a proportion of from 80 to 20% by mass.

* * * * *